United States Patent
Zercoe et al.

(10) Patent No.: US 9,870,880 B2
(45) Date of Patent: Jan. 16, 2018

(54) DOME SWITCH AND SWITCH HOUSING FOR KEYBOARD ASSEMBLY

(71) Applicant: Apple Inc., Cupertino, CA (US)

(72) Inventors: Bradford J. Zercoe, Cupertino, CA (US); Craig C. Leong, Cupertino, CA (US); James J. Niu, Cupertino, CA (US); John M. Brock, San Carlos, CA (US); Keith J. Hendren, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 1 day.

(21) Appl. No.: 14/867,598

(22) Filed: Sep. 28, 2015

(65) Prior Publication Data
US 2016/0172129 A1 Jun. 16, 2016

Related U.S. Application Data

(60) Provisional application No. 62/058,067, filed on Sep. 30, 2014, provisional application No. 62/129,840, (Continued)

(51) Int. Cl.
*H01H 9/26* (2006.01)
*H01H 13/72* (2006.01)
(Continued)

(52) U.S. Cl.
CPC ........... *H01H 13/06* (2013.01); *G06F 1/1662* (2013.01); *G06F 3/0202* (2013.01); *H01H 3/125* (2013.01);
(Continued)

(58) Field of Classification Search
CPC ............... H01H 13/85; H01H 2209/01; H01H 2215/00; H01H 2215/004;
(Continued)

(56) References Cited

U.S. PATENT DOCUMENTS 3,657,492 A 4/1972 Arndt et al.
3,917,917 A 11/1975 Murata
(Continued)

FOREIGN PATENT DOCUMENTS

CN 2155620 2/1994
CN 2394309 8/2000
(Continued)

OTHER PUBLICATIONS

Invitation to Pay Additional Fees, PCT/US2015/052739, 9 pp., Dec. 17, 2015.
(Continued)

*Primary Examiner* — Anthony R. Jimenez
(74) *Attorney, Agent, or Firm* — Brownstein Hyatt Farber Schreck, LLP

(57) ABSTRACT

A dome switch utilized in a keyboard assembly is disclosed. The keyboard assembly may include a printed circuit board having a first electrical connector formed in the printed circuit board, and a second electrical connector formed in the printed circuit board adjacent the first electrical connector. The keyboard assembly may also include an inner contact component contacting the second electrical connector of the printed circuit board. The inner contact component may be in electrical communication with the second electrical connector of the printed circuit board. Additionally, the keyboard assembly can include a dome switch surrounding the inner contact component. The dome switch may contact and may be in electrical communication with the first electrical connector of the printed circuit board.

19 Claims, 14 Drawing Sheets

Related U.S. Application Data filed on Mar. 7, 2015, provisional application No. 62/058,074, filed on Sep. 30, 2014, provisional application No. 62/129,841, filed on Mar. 7, 2015, provisional application No. 62/058,087, filed on Sep. 30, 2014, provisional application No. 62/129,842, filed on Mar. 7, 2015, provisional application No. 62/058,081, filed on Sep. 30, 2014, provisional application No. 62/129,843, filed on Mar. 7, 2015.

(51) Int. Cl.

| | | |
|---|---|---|
| *H01H 13/76* | (2006.01) | |
| *H01H 13/06* | (2006.01) | |
| *H01H 13/02* | (2006.01) | |
| *H01L 33/50* | (2010.01) | |
| *H01H 13/70* | (2006.01) | |
| *G06F 1/16* | (2006.01) | |
| *G06F 3/02* | (2006.01) | |
| *H01H 3/12* | (2006.01) | |
| *H01H 13/79* | (2006.01) | |
| *H01H 13/80* | (2006.01) | |
| *H01H 13/803* | (2006.01) | |
| *H01H 13/83* | (2006.01) | |
| *H01H 13/86* | (2006.01) | |
| *H01H 13/04* | (2006.01) | |

(52) U.S. Cl.
CPC .......... *H01H 13/023* (2013.01); *H01H 13/04* (2013.01); *H01H 13/70* (2013.01); *H01H 13/7006* (2013.01); *H01H 13/79* (2013.01); *H01H 13/80* (2013.01); *H01H 13/803* (2013.01); *H01H 13/83* (2013.01); *H01H 13/86* (2013.01); *H01L 33/50* (2013.01); *H01H 2203/004* (2013.01); *H01H 2203/038* (2013.01); *H01H 2203/056* (2013.01); *H01H 2205/016* (2013.01); *H01H 2205/024* (2013.01); *H01H 2207/04* (2013.01); *H01H 2211/028* (2013.01); *H01H 2213/01* (2013.01); *H01H 2213/016* (2013.01); *H01H 2215/038* (2013.01); *H01H 2219/036* (2013.01); *H01H 2219/052* (2013.01); *H01H 2219/06* (2013.01); *H01H 2219/062* (2013.01); *H01H 2221/076* (2013.01); *H01H 2227/026* (2013.01); *H01H 2229/046* (2013.01); *H01H 2239/004* (2013.01)

(58) Field of Classification Search
CPC ....... H01H 2215/024; H01H 2215/008; H01H 2215/012; H01H 2215/018; H01H 3/125; H01H 13/06; H01H 13/023; H01H 13/04; H01H 13/70; H01H 13/7006; H01H 13/79; H01H 13/80; H01H 13/803; H01H 13/83; H01H 13/86; H01H 2203/004; H01H 2203/038; H01H 2203/056; H01H 2205/016; H01H 2205/024; H01H 2207/04; H01H 2211/028; H01H 2213/01; H01H 2213/016; H01H 2215/038; H01H 2219/036; H01H 2219/052; H01H 2219/06; H01H 2219/062; H01H 2221/076; H01H 2227/026; H01H 2229/046; H01H 2239/004; G06F 1/1662; G06F 3/0202
USPC ....... 200/402, 405, 406, 408, 412, 440, 468, 200/5 A
See application file for complete search history.

(56) References Cited

U.S. PATENT DOCUMENTS

| | | |
|---|---|---|
| 3,978,297 A | 8/1976 | Lynn et al. |
| 4,095,066 A | 6/1978 | Harris |
| 4,319,099 A | 3/1982 | Asher |
| 4,349,712 A * | 9/1982 | Michalski ............ H01H 13/702 200/5 A |
| 4,484,042 A | 11/1984 | Matsui |
| 4,598,181 A * | 7/1986 | Selby ................... H01H 13/702 200/292 |
| 4,670,084 A | 6/1987 | Durand et al. |
| 4,755,645 A | 7/1988 | Naoki et al. |
| 4,937,408 A | 6/1990 | Hattori et al. |
| 5,021,638 A | 6/1991 | Nopper et al. |
| 5,092,459 A | 3/1992 | Uljanic et al. |
| 5,136,131 A | 8/1992 | Komaki |
| 5,278,372 A | 1/1994 | Takagi et al. |
| 5,280,146 A | 1/1994 | Inagaki et al. |
| 5,340,955 A | 8/1994 | Calvillo et al. |
| 5,382,762 A | 1/1995 | Mochizuki |
| 5,421,659 A | 6/1995 | Liang |
| 5,422,447 A | 6/1995 | Spence |
| 5,457,297 A | 10/1995 | Chen |
| 5,477,430 A | 12/1995 | LaRose et al. |
| 5,481,074 A | 1/1996 | English |
| 5,504,283 A | 4/1996 | Kako et al. |
| 5,512,719 A | 4/1996 | Okada et al. |
| 5,625,532 A | 4/1997 | Sellers |
| 5,804,780 A | 9/1998 | Bartha |
| 5,828,015 A | 10/1998 | Coulon |
| 5,847,337 A | 12/1998 | Chen |
| 5,874,700 A | 2/1999 | Hochgesang |
| 5,875,013 A | 2/1999 | Takahara |
| 5,876,106 A | 3/1999 | Kordecki et al. |
| 5,878,872 A | 3/1999 | Tsai |
| 5,881,866 A | 3/1999 | Miyajima et al. |
| 5,924,555 A * | 7/1999 | Sadamori ........... H01H 13/7006 200/238 |
| 5,935,691 A | 8/1999 | Tsai |
| 5,986,227 A | 11/1999 | Hon |
| 6,020,565 A | 2/2000 | Pan |
| 6,215,420 B1 | 4/2001 | Harrison et al. |
| 6,257,782 B1 | 7/2001 | Maruyama et al. |
| 6,377,685 B1 | 4/2002 | Krishnan |
| 6,388,219 B2 | 5/2002 | Hsu et al. |
| 6,482,032 B1 | 11/2002 | Szu et al. |
| 6,538,801 B2 | 3/2003 | Jacobson et al. |
| 6,542,355 B1 | 4/2003 | Huang |
| 6,552,287 B2 * | 4/2003 | Janniere ................. H01H 13/48 200/406 |
| 6,556,112 B1 | 4/2003 | Van Zeeland et al. |
| 6,559,399 B2 | 5/2003 | Hsu et al. |
| 6,572,289 B2 | 6/2003 | Lo et al. |
| 6,573,463 B2 | 6/2003 | Ono |
| 6,585,435 B2 | 7/2003 | Fang |
| 6,624,369 B2 | 9/2003 | Ito et al. |
| 6,706,986 B2 | 3/2004 | Hsu |
| 6,738,050 B2 | 5/2004 | Comiskey |
| 6,750,414 B2 | 6/2004 | Sullivan |
| 6,759,614 B2 | 7/2004 | Yoneyama |
| 6,762,381 B2 | 7/2004 | Kunthady et al. |
| 6,788,450 B2 | 9/2004 | Kawai et al. |
| 6,797,906 B2 | 9/2004 | Ohashi |
| 6,850,227 B2 | 2/2005 | Takahashi et al. |
| 6,860,660 B2 | 3/2005 | Hochgesang et al. |
| 6,926,418 B2 | 8/2005 | Osterg.ang.rd et al. |
| 6,940,030 B2 | 9/2005 | Takeda et al. |
| 6,977,352 B2 | 12/2005 | Oosawa |
| 6,979,792 B1 | 12/2005 | Lai |
| 6,987,466 B1 | 1/2006 | Welch et al. |
| 6,987,503 B2 | 1/2006 | Inoue |
| 7,012,206 B2 | 3/2006 | Oikawa |
| 7,030,330 B2 | 4/2006 | Suda |
| 7,038,832 B2 | 5/2006 | Kanbe |
| 7,129,930 B1 | 10/2006 | Cathey et al. |
| 7,134,205 B2 | 11/2006 | Bruennel |
| 7,146,701 B2 | 12/2006 | Mahoney et al. |

(56) References Cited

U.S. PATENT DOCUMENTS

| | | |
|---|---|---|
| 7,151,236 B2 | 12/2006 | Ducruet et al. |
| 7,151,237 B2 | 12/2006 | Mahoney et al. |
| 7,154,059 B2 | 12/2006 | Chou |
| 7,166,813 B2 * | 1/2007 | Soma .................. H03K 17/975 |
| | | 200/341 |
| 7,172,303 B2 | 2/2007 | Shipman et al. |
| 7,189,932 B2 | 3/2007 | Kim |
| 7,256,766 B2 | 8/2007 | Albert et al. |
| 7,283,119 B2 | 10/2007 | Kishi |
| 7,301,113 B2 | 11/2007 | Nishimura et al. |
| 7,378,607 B2 | 5/2008 | Koyano et al. |
| 7,385,806 B2 | 6/2008 | Liao |
| 7,391,555 B2 | 6/2008 | Albert et al. |
| 7,414,213 B2 | 8/2008 | Hwang |
| 7,429,707 B2 | 9/2008 | Yanai et al. |
| 7,432,460 B2 | 10/2008 | Clegg |
| 7,510,342 B2 | 3/2009 | Lane et al. |
| 7,531,764 B1 | 5/2009 | Lev et al. |
| 7,541,554 B2 | 6/2009 | Hou |
| 7,639,187 B2 | 12/2009 | Caballero et al. |
| 7,639,571 B2 | 12/2009 | Ishii et al. |
| 7,724,415 B2 | 5/2010 | Yamaguchi |
| 7,781,690 B2 | 8/2010 | Ishii |
| 7,813,774 B2 | 10/2010 | Perez-Noguera |
| 7,842,895 B2 | 11/2010 | Lee |
| 7,847,204 B2 | 12/2010 | Tsai |
| 7,851,819 B2 | 12/2010 | Shi |
| 7,866,866 B2 | 1/2011 | Wahlstrom |
| 7,893,376 B2 | 2/2011 | Chen |
| 7,923,653 B2 | 4/2011 | Ohsumi |
| 7,947,915 B2 | 5/2011 | Lee et al. |
| 7,999,748 B2 | 8/2011 | Ligtenberg et al. |
| 8,063,325 B2 | 11/2011 | Sung et al. |
| 8,077,096 B2 | 12/2011 | Chiang et al. |
| 8,080,744 B2 | 12/2011 | Yeh et al. |
| 8,098,228 B2 | 1/2012 | Shimodaira et al. |
| 8,109,650 B2 | 2/2012 | Chang et al. |
| 8,119,945 B2 | 2/2012 | Lin |
| 8,124,903 B2 | 2/2012 | Tatehata et al. |
| 8,134,094 B2 | 3/2012 | Tsao et al. |
| 8,143,982 B1 | 3/2012 | Lauder et al. |
| 8,156,172 B2 | 4/2012 | Muehl et al. |
| 8,178,808 B2 | 5/2012 | Strittmatter et al. |
| 8,184,021 B2 | 5/2012 | Chou |
| 8,212,160 B2 * | 7/2012 | Tsao ...................... H01H 13/64 |
| | | 200/1 B |
| 8,212,162 B2 | 7/2012 | Zhou |
| 8,218,301 B2 | 7/2012 | Lee |
| 8,232,958 B2 | 7/2012 | Tolbert |
| 8,246,228 B2 | 8/2012 | Ko et al. |
| 8,253,048 B2 | 8/2012 | Ozias et al. |
| 8,253,052 B2 | 8/2012 | Chen |
| 8,263,887 B2 | 9/2012 | Chen et al. |
| 8,289,280 B2 | 10/2012 | Travis |
| 8,299,382 B2 | 10/2012 | Takemae et al. |
| 8,317,384 B2 | 11/2012 | Chung et al. |
| 8,319,298 B2 | 11/2012 | Hsu |
| 8,325,141 B2 | 12/2012 | Marsden |
| 8,330,725 B2 | 12/2012 | Mahowald et al. |
| 8,354,629 B2 | 1/2013 | Lin |
| 8,378,857 B2 | 2/2013 | Pance |
| 8,383,972 B2 | 2/2013 | Liu |
| 8,384,566 B2 | 2/2013 | Bocirnea |
| 8,404,990 B2 | 3/2013 | Lutgring et al. |
| 8,451,146 B2 | 3/2013 | Mahowald et al. |
| 8,431,849 B2 | 4/2013 | Chen |
| 8,436,265 B2 | 5/2013 | Koike et al. |
| 8,462,514 B2 | 6/2013 | Myers et al. |
| 8,500,348 B2 | 8/2013 | Dumont et al. |
| 8,502,094 B2 | 8/2013 | Chen |
| 8,542,194 B2 | 9/2013 | Akens et al. |
| 8,548,528 B2 | 10/2013 | Kim et al. |
| 8,569,639 B2 | 10/2013 | Strittmatter |
| 8,575,632 B2 | 11/2013 | Kuramoto et al. |
| 8,581,127 B2 | 11/2013 | Jhuang et al. |
| 8,592,699 B2 | 11/2013 | Kessler et al. |
| 8,592,702 B2 | 11/2013 | Tsai |
| 8,592,703 B2 | 11/2013 | Johnson et al. |
| 8,604,370 B2 | 12/2013 | Chao |
| 8,629,362 B1 | 1/2014 | Knighton et al. |
| 8,651,720 B2 | 2/2014 | Sherman et al. |
| 8,659,882 B2 | 2/2014 | Liang et al. |
| 8,731,618 B2 | 5/2014 | Jarvis et al. |
| 8,748,767 B2 | 6/2014 | Ozias et al. |
| 8,759,705 B2 | 6/2014 | Funakoshi et al. |
| 8,760,405 B2 | 6/2014 | Nam |
| 8,786,548 B2 | 7/2014 | Oh et al. |
| 8,791,378 B2 | 7/2014 | Lan |
| 8,835,784 B2 | 9/2014 | Hirota |
| 8,847,711 B2 | 9/2014 | Yang et al. |
| 8,853,580 B2 | 10/2014 | Chen |
| 8,854,312 B2 | 10/2014 | Meierling |
| 8,870,477 B2 | 10/2014 | Merminod et al. |
| 8,884,174 B2 | 11/2014 | Chou et al. |
| 8,921,473 B1 | 12/2014 | Hyman |
| 8,922,476 B2 | 12/2014 | Stewart et al. |
| 8,943,427 B2 | 1/2015 | Heo et al. |
| 8,976,117 B2 | 3/2015 | Krahenbuhl et al. |
| 8,994,641 B2 | 3/2015 | Stewart et al. |
| 9,007,297 B2 | 4/2015 | Stewart et al. |
| 9,012,795 B2 | 4/2015 | Niu et al. |
| 9,029,723 B2 | 5/2015 | Pegg |
| 9,063,627 B2 | 6/2015 | Yairi et al. |
| 9,064,642 B2 | 6/2015 | Welch et al. |
| 9,086,733 B2 | 7/2015 | Pance |
| 9,087,663 B2 | 7/2015 | Los |
| 9,093,229 B2 | 7/2015 | Leong et al. |
| 9,213,416 B2 | 12/2015 | Chen |
| 9,223,352 B2 | 12/2015 | Smith et al. |
| 9,234,486 B2 | 1/2016 | Das et al. |
| 9,235,236 B2 | 1/2016 | Nam |
| 9,274,654 B2 | 3/2016 | Slobodin et al. |
| 9,275,810 B2 | 3/2016 | Pance et al. |
| 9,300,033 B2 | 3/2016 | Han et al. |
| 9,305,496 B2 | 4/2016 | Kimura |
| 9,443,672 B2 | 9/2016 | Martisauskas |
| 9,448,628 B2 | 9/2016 | Tan et al. |
| 9,471,185 B2 | 10/2016 | Guard |
| 9,612,674 B2 | 4/2017 | Degner et al. |
| 2001/0003326 A1 * | 6/2001 | Okada ..................... G01L 5/165 |
| | | 200/516 |
| 2002/0079211 A1 | 6/2002 | Katayama et al. |
| 2002/0093436 A1 | 7/2002 | Lien |
| 2002/0113770 A1 | 8/2002 | Jacobson et al. |
| 2002/0149835 A1 | 10/2002 | Kanbe |
| 2003/0169232 A1 | 9/2003 | Ito |
| 2004/0004559 A1 | 1/2004 | Rast |
| 2004/0225965 A1 | 11/2004 | Garside et al. |
| 2004/0257247 A1 | 12/2004 | Lin et al. |
| 2005/0035950 A1 | 2/2005 | Daniels |
| 2005/0253801 A1 | 11/2005 | Kobayashi |
| 2006/0011458 A1 | 1/2006 | Purcocks |
| 2006/0020469 A1 | 1/2006 | Rast |
| 2006/0120790 A1 | 6/2006 | Chang |
| 2006/0181511 A1 | 8/2006 | Woolley |
| 2006/0243987 A1 | 11/2006 | Lai |
| 2007/0102266 A1 * | 5/2007 | Wingett ............... H01H 25/041 |
| | | 200/5 A |
| 2007/0200823 A1 | 8/2007 | Bytheway et al. |
| 2007/0285393 A1 | 12/2007 | Ishakov |
| 2008/0131184 A1 | 6/2008 | Brown et al. |
| 2008/0136782 A1 | 6/2008 | Mundt et al. |
| 2008/0251370 A1 * | 10/2008 | Aoki ..................... H01H 13/79 |
| | | 200/534 |
| 2009/0046053 A1 | 2/2009 | Shigehiro et al. |
| 2009/0103964 A1 | 4/2009 | Takagi et al. |
| 2009/0128496 A1 | 5/2009 | Huang |
| 2009/0262085 A1 | 10/2009 | Wassingbo et al. |
| 2010/0045705 A1 | 2/2010 | Vertegaal et al. |
| 2010/0066568 A1 | 3/2010 | Lee |
| 2010/0156796 A1 | 6/2010 | Kim et al. |
| 2010/0253630 A1 | 10/2010 | Homma et al. |
| 2011/0032127 A1 | 2/2011 | Roush |
| 2011/0056817 A1 | 3/2011 | Wu |

(56) References Cited

U.S. PATENT DOCUMENTS

| | | | |
|---|---|---|---|
| 2011/0056836 A1 | 3/2011 | Tatebe et al. |
| 2011/0205179 A1 | 8/2011 | Braun |
| 2011/0261031 A1 | 10/2011 | Muto |
| 2011/0267272 A1 | 11/2011 | Meyer et al. |
| 2011/0303521 A1 | 12/2011 | Niu et al. |
| 2012/0012446 A1 | 1/2012 | Hwa |
| 2012/0032972 A1 | 2/2012 | Hwang |
| 2012/0090973 A1 | 4/2012 | Liu |
| 2012/0098751 A1 | 4/2012 | Liu |
| 2012/0286701 A1 | 11/2012 | Yang et al. |
| 2012/0298496 A1 | 11/2012 | Zhang |
| 2012/0313856 A1 | 12/2012 | Hsieh |
| 2013/0043115 A1 | 2/2013 | Yang et al. |
| 2013/0093500 A1 | 4/2013 | Bruwer |
| 2013/0093733 A1 | 4/2013 | Yoshida |
| 2013/0100030 A1 | 4/2013 | Los et al. |
| 2013/0120265 A1 | 5/2013 | Horii et al. |
| 2013/0215079 A1 | 8/2013 | Johnson et al. |
| 2013/0242601 A1 | 9/2013 | Kloeppel et al. |
| 2013/0270090 A1 | 10/2013 | Lee |
| 2014/0015777 A1 | 1/2014 | Park et al. |
| 2014/0071654 A1 | 3/2014 | Chien |
| 2014/0082490 A1 | 3/2014 | Jung et al. |
| 2014/0090967 A1 | 4/2014 | Inagaki |
| 2014/0098042 A1 | 4/2014 | Kuo et al. |
| 2014/0116865 A1 | 5/2014 | Leong et al. |
| 2014/0118264 A1 | 5/2014 | Leong et al. |
| 2014/0151211 A1 | 6/2014 | Zhang |
| 2014/0191973 A1 | 7/2014 | Zellers et al. |
| 2014/0218851 A1 | 8/2014 | Klein et al. |
| 2014/0252881 A1 | 9/2014 | Dinh et al. |
| 2014/0291133 A1 | 10/2014 | Fu et al. |
| 2014/0320436 A1 | 10/2014 | Modarres et al. |
| 2014/0346025 A1 | 11/2014 | Hendren et al. |
| 2014/0375141 A1 | 12/2014 | Nakajima |
| 2015/0016038 A1 | 1/2015 | Niu et al. |
| 2015/0083561 A1 | 3/2015 | Han et al. |
| 2015/0090570 A1 | 4/2015 | Kwan et al. |
| 2015/0090571 A1 | 4/2015 | Leong et al. |
| 2015/0227207 A1 | 8/2015 | Winter et al. |
| 2015/0243457 A1 | 8/2015 | Niu et al. |
| 2015/0270073 A1 | 9/2015 | Yarak, III et al. |
| 2015/0277559 A1 | 10/2015 | Vescovi et al. |
| 2015/0287553 A1 | 10/2015 | Welch et al. |
| 2015/0309538 A1 | 10/2015 | Zhang |
| 2015/0332874 A1 | 11/2015 | Brock et al. |
| 2015/0348726 A1 | 12/2015 | Hendren |
| 2015/0378391 A1 | 12/2015 | Huitema et al. |
| 2016/0049266 A1 | 2/2016 | Stringer et al. |
| 2016/0093452 A1 | 3/2016 | Zercoe et al. |
| 2016/0172129 A1 | 6/2016 | Zercoe et al. |
| 2016/0189890 A1 | 6/2016 | Leong et al. |
| 2016/0189891 A1 | 6/2016 | Zercoe et al. |
| 2016/0259375 A1 | 9/2016 | Andre et al. |
| 2016/0336124 A1 | 11/2016 | Leong et al. |
| 2016/0336127 A1 | 11/2016 | Leong et al. |
| 2016/0336128 A1 | 11/2016 | Leong et al. |
| 2016/0343523 A1 | 11/2016 | Hendren et al. |
| 2016/0351360 A1 | 12/2016 | Knopf et al. |
| 2016/0365204 A1 | 12/2016 | Cao et al. |
| 2016/0378234 A1 | 12/2016 | Ligtenberg et al. |
| 2016/0379775 A1 | 12/2016 | Leong et al. |
| 2017/0004937 A1 | 1/2017 | Leong et al. |
| 2017/0004939 A1 | 1/2017 | Kwan et al. |
| 2017/0011869 A1 | 1/2017 | Knopf et al. |
| 2017/0090106 A1 | 3/2017 | Cao et al. |

FOREIGN PATENT DOCUMENTS

| | | |
|---|---|---|
| CN | 1533128 | 9/2004 |
| CN | 1542497 | 11/2004 |
| CN | 2672832 | 1/2005 |
| CN | 1624842 | 6/2005 |
| CN | 1812030 | 8/2006 |
| CN | 1838036 | 9/2006 |
| CN | 1855332 | 11/2006 |
| CN | 101051569 | 10/2007 |
| CN | 200961844 | 10/2007 |
| CN | 200986871 | 12/2007 |
| CN | 101146137 | 3/2008 |
| CN | 201054315 | 4/2008 |
| CN | 201084602 | 7/2008 |
| CN | 201123174 | 9/2008 |
| CN | 201149829 | 11/2008 |
| CN | 101315841 | 12/2008 |
| CN | 201210457 | 3/2009 |
| CN | 101465226 | 6/2009 |
| CN | 101494130 | 7/2009 |
| CN | 101502082 | 8/2009 |
| CN | 201298481 | 8/2009 |
| CN | 101546667 | 9/2009 |
| CN | 101572195 | 11/2009 |
| CN | 101800281 | 8/2010 |
| CN | 101807482 | 8/2010 |
| CN | 101868773 | 10/2010 |
| CN | 201655616 | 11/2010 |
| CN | 102110542 | 6/2011 |
| CN | 102119430 | 7/2011 |
| CN | 201904256 | 7/2011 |
| CN | 102163084 | 8/2011 |
| CN | 201927524 | 8/2011 |
| CN | 201945951 | 8/2011 |
| CN | 201945952 | 8/2011 |
| CN | 201956238 | 8/2011 |
| CN | 102197452 | 9/2011 |
| CN | 202008941 | 10/2011 |
| CN | 202040690 | 11/2011 |
| CN | 102280292 | 12/2011 |
| CN | 102338348 | 2/2012 |
| CN | 102375550 | 3/2012 |
| CN | 202205161 | 4/2012 |
| CN | 102496509 | 6/2012 |
| CN | 10269527 | 8/2012 |
| CN | 102622089 | 8/2012 |
| CN | 102629526 | 8/2012 |
| CN | 202372927 | 8/2012 |
| CN | 102679239 | 9/2012 |
| CN | 102683072 | 9/2012 |
| CN | 202434387 | 9/2012 |
| CN | 202523007 | 11/2012 |
| CN | 102832068 | 12/2012 |
| CN | 102955573 | 3/2013 |
| CN | 102956386 | 3/2013 |
| CN | 102969183 | 3/2013 |
| CN | 103000417 | 3/2013 |
| CN | 103165327 | 6/2013 |
| CN | 103180979 | 6/2013 |
| CN | 203012648 | 6/2013 |
| CN | 203135988 | 8/2013 |
| CN | 103377841 | 10/2013 |
| CN | 103489986 | 1/2014 |
| CN | 203414880 | 1/2014 |
| CN | 103681056 | 3/2014 |
| CN | 103699181 | 4/2014 |
| CN | 203520312 | 4/2014 |
| CN | 203588895 | 5/2014 |
| CN | 103839715 | 6/2014 |
| CN | 103839720 | 6/2014 |
| CN | 103839722 | 6/2014 |
| CN | 103903891 | 7/2014 |
| CN | 103956290 | 7/2014 |
| CN | 203733685 | 7/2014 |
| CN | 104021968 | 9/2014 |
| CN | 204102769 | 1/2015 |
| CN | 204117915 | 1/2015 |
| CN | 104517769 | 4/2015 |
| CN | 204632641 | 9/2015 |
| CN | 105097341 | 11/2015 |
| DE | 2530176 | 1/1977 |
| DE | 3002772 | 7/1981 |
| DE | 29704100 | 4/1997 |
| EP | 0441993 | 8/1991 |
| EP | 1835272 | 9/2007 |
| EP | 1928008 | 6/2008 |

(56) References Cited

FOREIGN PATENT DOCUMENTS

| | | |
|---|---|---|
| EP | 2022606 | 6/2010 |
| EP | 2426688 | 3/2012 |
| EP | 2439760 | 4/2012 |
| EP | 2664979 | 11/2013 |
| FR | 2147420 | 3/1973 |
| FR | 2911000 | 7/2008 |
| FR | 2950193 | 3/2011 |
| GB | 1361459 | 7/1974 |
| JP | S50115562 | 9/1975 |
| JP | S60055477 | 3/1985 |
| JP | S61172422 | 10/1986 |
| JP | S62072429 | 4/1987 |
| JP | S63182024 | 11/1988 |
| JP | H0422024 | 4/1992 |
| JP | H0520963 | 1/1993 |
| JP | H0524512 | 8/1993 |
| JP | H05342944 | 12/1993 |
| JP | H09204148 | 8/1997 |
| JP | H10312726 | 11/1998 |
| JP | H11194882 | 7/1999 |
| JP | 2000010709 | 1/2000 |
| JP | 2000057871 | 2/2000 |
| JP | 2000339097 | 12/2000 |
| JP | 2001100889 | 4/2001 |
| JP | 2003114751 | 9/2001 |
| JP | 2002260478 | 9/2002 |
| JP | 2002298689 | 10/2002 |
| JP | 2003522998 | 7/2003 |
| JP | 2005108041 | 4/2005 |
| JP | 2006164929 | 6/2006 |
| JP | 2006185906 | 7/2006 |
| JP | 2006521664 | 9/2006 |
| JP | 2006269439 | 10/2006 |
| JP | 2006277013 | 10/2006 |
| JP | 2006344609 | 12/2006 |
| JP | 2007115633 | 5/2007 |
| JP | 2007514247 | 5/2007 |
| JP | 2007156983 | 6/2007 |
| JP | 2008021428 | 1/2008 |
| JP | 2008041431 | 2/2008 |
| JP | 2008100129 | 5/2008 |
| JP | 2008191850 | 8/2008 |
| JP | 2008533559 | 8/2008 |
| JP | 2008293922 | 12/2008 |
| JP | 2009099503 | 5/2009 |
| JP | 2009181894 | 8/2009 |
| JP | 2010061956 | 3/2010 |
| JP | 2010244088 | 10/2010 |
| JP | 2010244302 | 10/2010 |
| JP | 2011018484 | 1/2011 |
| JP | 2011065126 | 3/2011 |
| JP | 2011150804 | 8/2011 |
| JP | 2011165630 | 8/2011 |
| JP | 2011524066 | 8/2011 |
| JP | 2011187297 | 9/2011 |
| JP | 2012022473 | 2/2012 |
| JP | 2012043705 | 3/2012 |
| JP | 2012063630 | 3/2012 |
| JP | 2012098873 | 5/2012 |
| JP | 2012134064 | 7/2012 |
| JP | 2012186067 | 9/2012 |
| JP | 2012230256 | 11/2012 |
| JP | 2014017179 | 1/2014 |
| JP | 2014026807 | 2/2014 |
| JP | 2014216190 | 11/2014 |
| JP | 2014220039 | 11/2014 |
| KR | 1019990007394 | 1/1999 |
| KR | 1020020001668 | 1/2002 |
| KR | 100454203 | 10/2004 |
| KR | 1020060083032 | 7/2006 |
| KR | 1020080064116 | 7/2008 |
| KR | 1020080066164 | 7/2008 |
| KR | 2020110006385 | 6/2011 |
| KR | 1020120062797 | 6/2012 |
| KR | 1020130040131 | 4/2013 |
| KR | 20150024201 | 3/2015 |
| TW | 200703396 | 1/2007 |
| TW | M334397 | 6/2008 |
| TW | 201108284 | 3/2011 |
| TW | 201108286 | 3/2011 |
| TW | M407429 | 7/2011 |
| TW | 201246251 | 11/2012 |
| TW | 201403646 | 1/2014 |
| WO | WO9744946 | 11/1997 |
| WO | WO2005/057320 | 6/2005 |
| WO | WO2006/022313 | 3/2006 |
| WO | WO2007/049253 | 5/2007 |
| WO | WO2008/045833 | 4/2008 |
| WO | WO2009/005026 | 1/2009 |
| WO | WO2012/011282 | 1/2012 |
| WO | WO2012/027978 | 3/2012 |
| WO | WO2013/096478 | 6/2013 |
| WO | WO2014175446 | 10/2014 |

OTHER PUBLICATIONS

U.S. Appl. No. 15/014,596, filed Feb. 3, 2016, pending.
U.S. Appl. No. 15/154,682, filed May 13, 2016, pending.
U.S. Appl. No. 15/154,706, filed May 13, 2016, pending.
U.S. Appl. No. 15/154,723, filed May 13, 2016, pending.
U.S. Appl. No. 15/154,768, filed May 13, 2016, pending.
U.S. Appl. No. 15/230,740, filed Aug. 8, 2016, pending.
U.S. Appl. No. 15/230,724, filed Aug. 8, 2016, pending.
U.S. Appl. No. 15/261,954, filed Sep. 11, 2016, pending.
U.S. Appl. No. 15/261,972, filed Sep. 11, 2016, pending.
U.S. Appl. No. 15/262,249, filed Sep. 12, 2016, pending.
U.S. Appl. No. 15/264,827, filed Sep. 14, 2016, pending.
U.S. Appl. No. 15/268,518, filed Sep. 16, 2016, pending; and.
U.S. Appl. No. 15/269,790, filed Sep. 19, 2016, pending.
U.S. Appl. No. 14/472,260, filed Aug. 28, 2014, pending.
U.S. Appl. No. 14/501,680, filed Sep. 30, 2014, pending.
U.S. Appl. No. 14/736,151, filed Jun. 10, 2015, pending.
U.S. Appl. No. 14/765,145, filed Jul. 31, 2015, pending.
U.S. Appl. No. 14/826,590, filed Aug. 14, 2015, pending.
U.S. Appl. No. 14/867,672, filed Sep. 28, 2015, pending.
U.S. Appl. No. 14/867,712, filed Sep. 28, 2015, pending; and.
U.S. Appl. No. 14/867,746, filed Sep. 28, 2015, pending.
Elekson, "Reliable and Tested Wearable Electronics Embedment Solutions," http://www.wearable.technology/our-technologies, 3 pages, at least as early as Jan. 6, 2016.

* cited by examiner

DOME SWITCH AND SWITCH HOUSING FOR KEYBOARD ASSEMBLY

CROSS-REFERENCE TO RELATED APPLICATIONS

This application is a nonprovisional patent application of and claims the benefit to U.S. Provisional Patent Application No. 62/058,067, filed Sep. 30, 2014 and titled "Keyboard Assembly," U.S. Provisional Patent Application No. 62/129,840, filed Mar. 7, 2015, and titled "Dome Switch for Keyboard Assembly," U.S. Provisional Patent Application No. 62/058,074, filed Sep. 30, 2014, and titled "Keyboard Assembly," U.S. Provisional Patent Application No. 62/129,841, filed Mar. 7, 2015, and titled "Key for Keyboard Assembly," U.S. Provisional Patent Application No. 62/058,087, filed Sep. 30, 2014, and titled "Keyboard Assembly," U.S. Provisional Patent Application No. 62/129,842, filed Mar. 7, 2015, and titled "Venting System for Keyboard Assembly," U.S. Provisional Patent Application No. 62/058,081, filed Sep. 30, 2014, and titled "Keyboard Assembly," and U.S. Provisional Patent Application No. 62/129,843, filed Mar. 7, 2015, and titled "Light Assembly for Keyboard Assembly," the disclosures of which are hereby incorporated herein by reference in their entirety.

FIELD

The disclosure relates generally to a keyboard assembly and, more particularly, to a dome switch utilized in a keyboard assembly.

BACKGROUND

Electronic devices typically include one or more input devices such as keyboards, touchpads, mice, or touchscreens to enable a user to interact with the device. These devices can be integrated into an electronic device or can stand alone as discrete devices that can transmit signals to another device via wired or wireless connection. For example, a keyboard can be integrated into the casing of a laptop computer. When integrated within the casing of the laptop computer, all of the components of the keyboard must be included within the casing of the laptop computer.

In a conventional keyboard, users can provide inputs to electronic devices using one or more dome switches included within the key assemblies of the keyboard. Using a traditional dome switch, a user can at least partially invert a dome to close an electrical circuit underneath the dome and provide a detectable input. The dome switch is typically constructed by placing a conductive dome over a contact pad on a circuit board. When the dome is pressed, the dome can invert such that the inner surface of the dome contacts the contact pad and provides a conductive path between the periphery of the dome and the contact pad. The dome inversion can also provide a tactile 'click' that enhances the user's interaction with the switch. A user can actuate a dome switch using any suitable approach including, for example, by applying a force directly to the dome or by pressing a cosmetic component having a nub that is aligned with the dome.

However, as a result of the construction of conventional dome switches and the electrical contacts used to provide an input to electronic device, the electrical input signal may only be sent after the dome switch has been inverted and released. For example, an electrical input signal may only be sent when a conventional dome switch is inverted and subsequently released or reshaped, using a conventional dome switch. As a result, the user input may be delayed and/or not able to provide accurate input when a user provides multiple inputs in a short amount of time. Additionally, where a user does not provide enough force to completely invert the dome switch, an input may not even be provided to the electronic device.

SUMMARY

A keyboard assembly is disclosed. The keyboard assembly comprises: a printed circuit board comprising: a first electrical connector; and a second electrical connector adjacent the first electrical connector; an inner contact component contacting and in electrical communication with the second electrical connector; and a dome switch surrounding the inner contact component, the dome switch contacting and in electrical communication with the first electrical connector; wherein the printed circuit board defines an aperture beneath the inner contact component; and the inner contact component is configured to extend into the aperture when deformed.

A keyboard assembly is disclosed. The keyboard assembly comprises a dome switch comprising a top portion positioned adjacent a keycap of the keyboard assembly, a bottom portion positioned opposite the top portion, and an end extending from the bottom portion. The keyboard assembly also comprises a printed circuit board positioned beneath the dome switch and supporting the dome switch. The end passes at least partially through at least one of the printed circuit board and a switch housing coupled to the printed circuit board, and the end is electrically grounded within at least one of the printed circuit board and the switch housing.

A keyboard assembly is disclosed. The keyboard assembly comprises a printed circuit board and a switch housing positioned on a first surface of the printed circuit board. The switch housing defining a switch opening. The keyboard assembly also comprises a dome switch positioned within the switch opening of the switch housing. The dome switch includes a set of contact protrusions extending from a body of the dome switch. Each of the set of contact protrusions extends angularly toward the printed circuit board.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
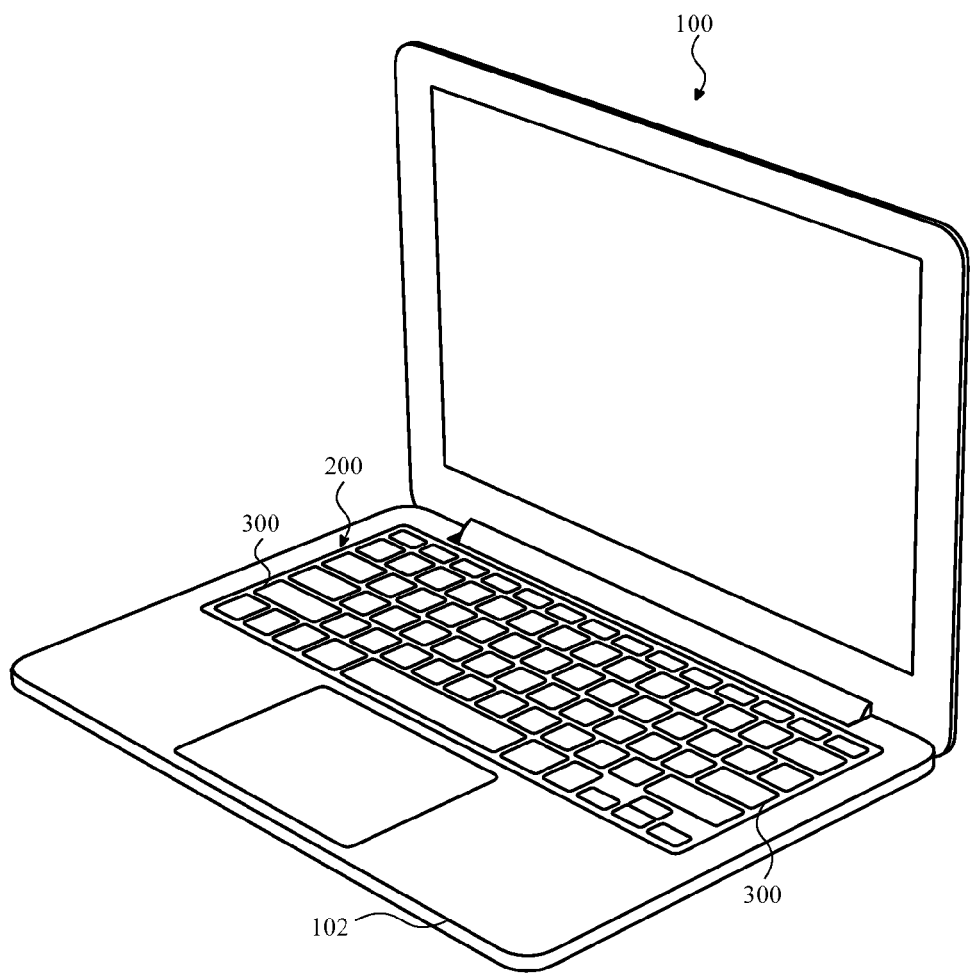
FIG. 1 shows an electronic device including a low-travel keyboard assembly, according to embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to a keyboard assembly and, more particularly, to a dome switch utilized in a keyboard assembly.

In a particular embodiment, the dome switch may include a set of tuning members integrated within a body of the dome switch and a set of contact protrusions extending from the body. The tuning members may be apertures or void spaces, for example. The contact protrusions may extend into the tuning members and may be positioned angularly toward a bottom portion of the body of the dome switch. The protrusions may contact an electrical connector to cooperatively generate an electrical signal when the dome switch is in a partially-collapsed state. As such, a user may not need to completely collapse the dome switch before an electrical connection is made within a keyboard assembly. This may result in faster response and/or interaction time between a user and the electronic device utilizing a keyboard assembly including the dome switch. Additionally, the travel distance of the dome switch of the keyboard assembly is also reduced. With a reduced travel distance, the height and/or size of the keyboard assembly, the components of the keyboard assembly and/or the electronic device utilizing the keyboard assembly can also be reduced.

In another particular embodiment, the dome switch may surround an inner contact component contacting and in electrical communication with electrical connectors formed on a printed circuit board. The inner contact component may be configured as a plate, a second dome switch, a strip, a plug, or any other component that may be in electrical communication with the printed circuit board. The inner contact component is also positioned above the printed circuit board and positioned below and/or surrounded by the dome switch.

When the dome switch is partially collapsed, it contacts the inner contact component and an electrical connection is formed, thereby generating an input signal for the electronic device. In some embodiments, the dome switch and inner contact component may thus cooperatively form the electrical connection. Further, the use of the inner contact component with the dome switch improves response and/or interaction time with the electronic device, and/or reduces the travel distance of the dome switch for forming an electrical signal. The reduction in the travel distance allows the keyboard assembly including the dome switch and inner contact component to require less space within the electronic device, which can results in a reduction in size of the keyboard assembly and/or the electronic device.

These and other embodiments are discussed below with reference to FIGS. 1-13. However, those skilled in the art will readily appreciate that the detailed description given herein with respect to these Figures is for explanatory purposes only and should not be construed as limiting.

FIG. 1 shows an electronic device 100 including a low-travel keyboard assembly 200 that may incorporate a dome switch with tuning members and contact protrusions, as described in more detail below with respect to FIGS. 2 and 3. In a non-limiting example, as shown in FIG. 1, electronic device 100 may be a laptop computer. However, it is understood that electronic device 100 may be configured as any suitable electronic device that may utilize low-travel keyboard assembly 200. Other embodiments can implement electronic device 100 differently, such as, for example, a desktop computer, a tablet computing device, a smartphone, a gaming device, a display, a digital music player, a wearable computing device or display, a health monitoring device, and so on. Electronic device 100 may include a top case 102. Top case 102 may take the form of an exterior, protective casing or shell for electronic device 100 and the various internal components (for example, low-travel keyboard assembly 200) of electronic device 100. Top case 102 may be formed as a single, integral component or may have a group of distinct components that may be configured to be coupled to one another, as discussed herein. Additionally, top case 102 may be formed from any suitable material that provides a protective casing or shell for electronic device 100 and the various components included in electronic device 100. In non-limiting examples, top case 102 may be made from metal, a ceramic, a rigid plastic or another polymer, a fiber-matrix composite, and so on.

Low-travel keyboard assembly 200 may be included within electronic device 100 to allow a user to interact with electronic device 100. As shown in FIG. 1, low-travel keyboard assembly 200 is positioned within and/or may be received by top case 102 of electronic device 100. Low-travel keyboard assembly 200 may include a set of keycaps 300 positioned within and partially protruding through and/or surrounded by top case 102 of electronic device 100. As discussed herein, keycaps 300 are depressed and displaced to interact and/or collapse a dome switch of low-travel keyboard assembly 200, which in turn forms an electrical signal or input to electronic device 100.

As discussed herein, each key of the low-travel keyboard assembly 200 includes a dome switch positioned below a keycap 300. The dome switch is configured to provide input to electronic device 100 when keycap 300 is depressed by a user. The dome switch can include a set of contact protrusions extending from the body. The contact protrusions extend into tuning members, toward electrical connectors or contacts formed on an internal component (e.g., a printed circuit board or other substrate) of the electronic device 100. The protrusions can contact an electrical connector and thus generate an electrical signal (e.g., an input to electronic device 100) when the dome switch is only partially collapsed.

In another embodiment, the dome switch of the low-travel keyboard assembly 200 can include a contact plate, second dome, strip or plug formed below the dome switch and in electrical communication with the electrical connectors or contacts formed on an internal component of the electronic device 100. Dependent on the size and/or position on the dome switch, contact plate and/or plug, the dome switch can contact the plate or plug form the electrical signal in electronic device 100 without necessarily being completely compressed or collapsed. Similar to the dome switch having the contact protrusions, the dome switch contacting the plate or plug to form the electrical signal may do so without being completely collapsed, thereby increasing input response speed and/or interaction time with electronic device 100, as well as decreasing a travel distance of keycap 300, and thereby reducing a required height of keycap 300 and/or low-travel keyboard assembly 200, as compared to conventional keyboards.

Additionally, and as discussed herein, the dome switch is positioned within and substantially surrounded by a switch housing of low-travel keyboard assembly 200. The switch housing substantially protects and/or seals the dome switch from being damaged over the operational life of electronic device 100. A portion of the dome switch can be positioned through a portion of the switch housing of low-travel keyboard assembly 200 and/or at least a portion of an internal component (e.g., printed circuit board) of the electronic device 100 coupled to and/or positioned adjacent the switch housing. Positioning a portion of the dome switch through the switch housing of low-travel keyboard assembly 200 and/or at least a portion of an internal component of the electronic device 100 secures the dome switch within low-travel keyboard assembly 200, and prevents the dome switch from becoming misaligned or removed from electronic device 100.

In the non-limiting example shown in FIG. 1, where electronic device 100 is a laptop computer, low-travel keyboard assembly 200 may be positioned within and/or may be received by electronic device 100, as discussed herein. In an additional embodiment, low-travel keyboard assembly 200 may be a distinct, standalone component and may be in electronic communication (for example, wired, wireless, Bluetooth, etc.) with electronic device 100.

Figure 2:
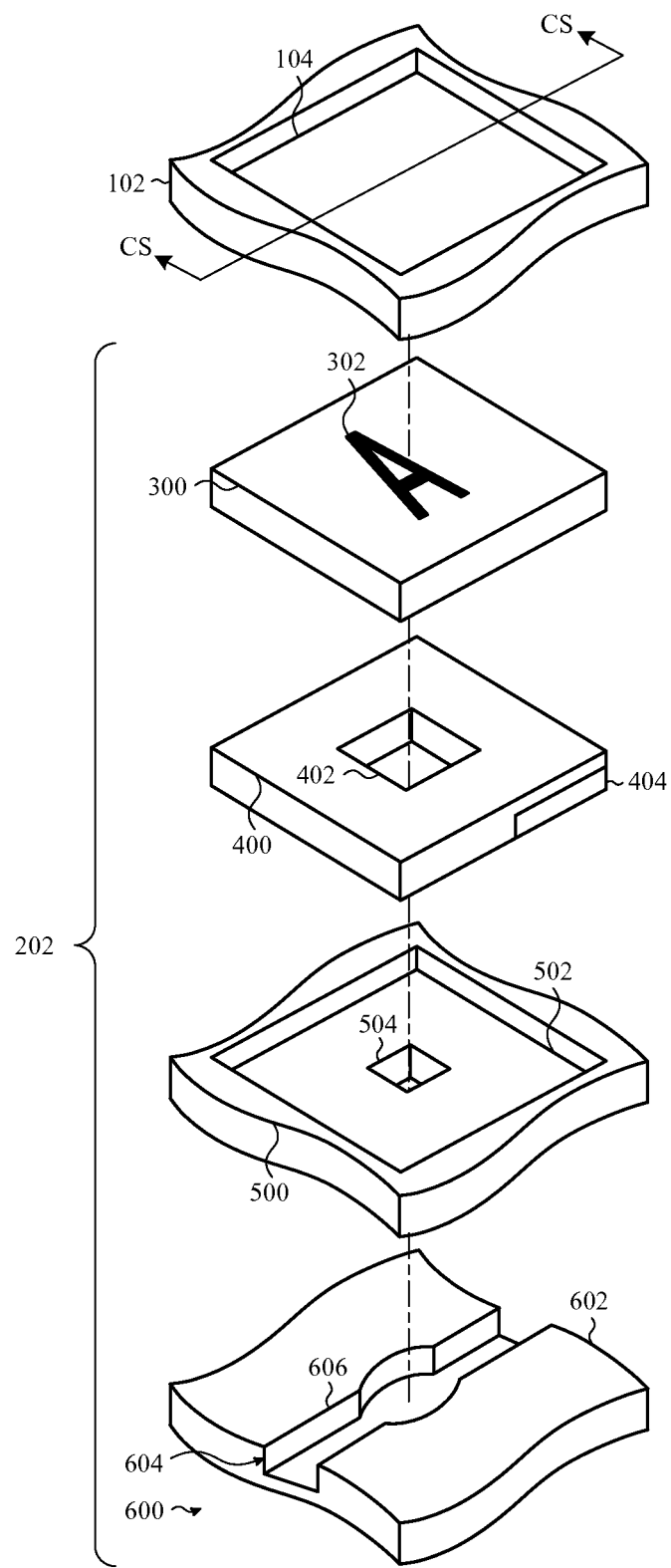
FIG. 2 shows an exploded view of a single key of the low-travel keyboard assembly of FIG. 1, according to embodiments.

FIG. 2 shows a detailed exploded view of a portion of top case 102 of electronic device 100 and a single key structure 202 of low-travel keyboard assembly 200. FIG. 3 shows a cross-section view of electronic device 100 and low-travel key structure 202, taken along line CS-CS in FIG. 2. It is understood that similarly named components or similarly numbered components may function in a substantially similar fashion, may include similar materials and/or may include similar interactions with other components. Redundant explanation of such components has been omitted for clarity.

Figure 3:
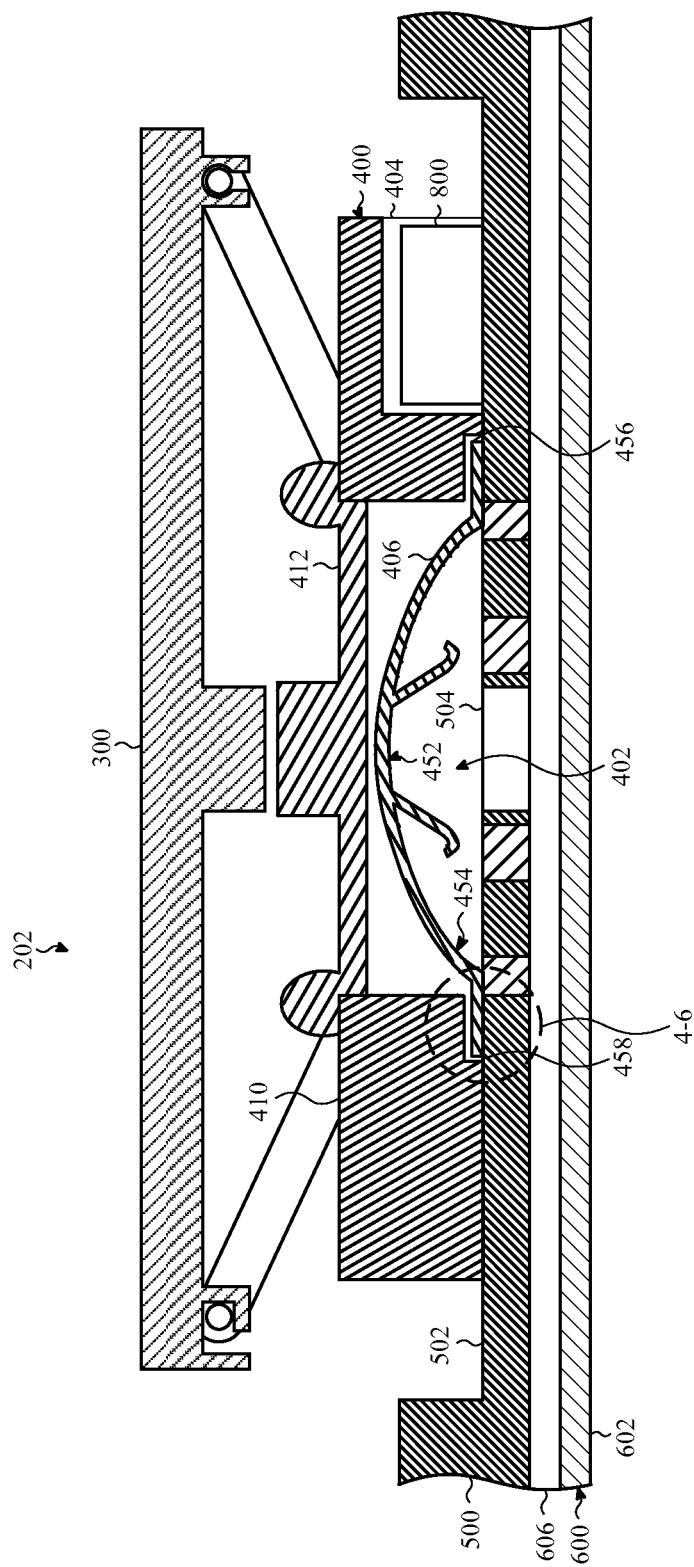
FIG. 3 shows a cross-section view of the single key of the low-travel keyboard assembly including a dome switch and a switch housing, taken along line CS-CS of FIG. 2, according to embodiments.

As shown in FIGS. 2 and 3, top case 102 of electronic device 100 may include one or more key holes 104 formed therethrough. Top case 102 may also include supports, such as ribs, positioned between the keycaps 300, and may substantially surround and/or may be positioned within the space between the keycaps 300 of low-travel keyboard assembly 200.

Low-travel keyboard assembly 200 may be formed from a number of layers or components positioned adjacent to and/or coupled to one another. The components positioned in layers may be positioned adjacent to and/or coupled to one another and may be sandwiched between top case 102 and a bottom case (not shown) of electronic device 100.

The keycaps 300 of low-travel keyboard assembly 200 may be positioned within, and extend through and/or partially above key holes 104 of top case 102. Each of the keycaps 300 may include a glyph 302 positioned on a top or exposed surface of the keycap 300. Each glyph 302 of keycap 300 may be substantially transparent to allow a light to be emitted through and/or illuminate keycap 300. In the non-limiting example shown in FIGS. 2 and 3, keycap 300 may be substantially opaque, except for glyph 302. As a result, glyph 302 and the perimeter of keycap 300 may be substantially illuminated by light emitted within low-travel keyboard assembly 200. The keycaps 300 may be positioned above corresponding switch housings 400 of low-travel keyboard assembly 200, and may interact with, a corresponding switch housing 400 and components positioned therein (e.g., dome switch).

As shown in FIGS. 2 and 3, each switch housing 400 of low-travel keyboard assembly 200 may include a dome switch opening 402 formed partially or completely through switch housing 400, and a light source recess 404 formed within each switch housing 400. Additionally shown in FIG. 3, dome switch opening 402 may receive and/or house a dome switch 406 for low-travel keyboard assembly 200 which forms an electrical signal to interact with electronic device 100 (see, FIG. 1). Light source recess 404 is formed in switch housing 400 and may receive a light source assembly 800 (see, FIG. 3), which may emit light through switch housing 400 for illuminating keycap 300 of low-travel keyboard assembly 200.

As shown in FIG. 3 and discussed herein in detail, dome switch opening 402 may receive and/or house dome switch 406, which may be collapsed by keycap 300 to form an electrical connection or signal to interact with electronic device 100. Dome switch 406 (positioned within dome switch opening 402) may include a distinct configuration or structure that facilitates an electrical connection, although this is not necessary and some dome switches 406 may lack such configurations/structures. Briefly, dome switch 406 may include one or more protrusion extending toward PCB 500. These protrusions may be angled toward the PCB and/or may contact PCB 500 to generate an electrical signal when dome switch 406 is at least partially collapsed, as discussed herein. Additionally, dome switch 406 includes an end and/or bottom portion that is secured within switch housing 400 and/or PCB 500 to prevent dome switch from becoming removed from and/or misaligned within switch housing 400.

As shown in FIG. 3, switch housing 400 may include a body portion 410 and a top panel 412 formed integrally and molded to body portion 410. Body portion 410 of switch housing 400 may include dome switch opening 402 and light source recess 404 formed adjacent dome switch opening 402, and may be directly coupled to PCB 500 within recess 502, as shown in FIG. 3. Top panel 412 may cover switch opening 402 formed in body portion 410. Body portion 410 may be formed from a rigid material for supporting keycap 300 during operation of low-travel keyboard assembly 200 and/or protecting the various components (e.g., dome switch 406, light source assembly 800) included within switch housing 400. Top panel 412 may be formed from a substantially flexible or deformable material to protect dome switch 406 from undesired wear caused by keycap 300 impacting dome switch 406 causing dome switch to collapse, as discussed herein. The materials forming body portion 410 and/or top panel 412 may include transparent properties to allow light emitted by the light source assembly 800 to pass through body portion 410 toward keycap 300, and/or reflective properties for reflecting the light emitted by the light source assembly 800 to be redirected toward keycap 300. The light source of the light source assembly may be a light-emitting diode, organic light-emitting diode, quantum dot, cold cathode fluorescent lamp, or any other suitable light source.

Low-travel keyboard assembly 200 may also include a printed circuit board (PCB) 500 positioned below the group of switch housings 400. As shown in FIGS. 2 and 3, PCB 500 may include a number of recesses 502 formed within PCB 500; each recess 502 of PCB 500 may receive and secure a corresponding portion of switch housing 400. PCB 500 may also include one or more apertures 504 formed completely through PCB 500 in recess 502. As shown in FIGS. 2 and 3, aperture 504 of PCB 500 may be substantially aligned with dome switch opening 402 of switch housing 400 of low-travel keyboard assembly 200. As discussed herein, the apertures 504 of PCB 500 may be utilized to receive a portion of dome switch 406 positioned within switch housing 400 when dome switch 406 is collapsed by keycap 300. PCB 500 may provide a rigid support structure for switch housing 400 and the various components forming low-travel keyboard assembly 200.

Low-travel keyboard assembly 200, as shown in FIGS. 2 and 3, may include a keyboard shield 600 positioned below PCB 500. Keyboard shield 600 may be formed from a conductive adhesive sheet 602 adhered to PCB 500 opposite switch housing 400. Conductive adhesive sheet 602 of shield 600 may include a venting system 604 which vents air expelled from switch housing 400 when dome switch 406 is collapsed by keycap 300, as discussed herein. As shown in FIGS. 2 and 3, venting system 604 may include a group of channels 606 formed within and/or partially through conductive adhesive sheet 602 of shield 600 which may be in fluid communication and/or may be substantially aligned with dome switch opening 402 formed in switch housing 400 and aperture 504 formed through PCB 500. Conductive adhesive sheet 602 of keyboard shield 600 may be utilized to transmit signals to and/or from PCB 500 of keyboard assembly 200 during user interaction. Adhesive sheet 602 of shield 600 is shown as separated from PCB 500 of keyboard assembly 200 in this cross-sectional view, insofar as the cross-section is taken through a channel 606 (see, FIG. 2) of shield 600.

As discussed herein, and shown in FIGS. 3-8, dome switch 406 may be positioned within dome switch opening 402 of switch housing 400 and may form an electrical contact within low-travel keyboard assembly 200 when a user interacts with electronic device 100 (e.g., presses a key). Dome switch 406 may be substantially secured within dome switch opening 402 of switch housing 400 to prevent dome switch 406 from moving within dome switch opening 402 and ultimately being electrically disconnected and/or unable to form an electrical contact within low-travel keyboard assembly 200. Dome switch 406 may be coupled to and/or positioned at least partially through switch housing 400 and/or PCB 500 to secure dome switch 406 within switch housing 400.

As shown in FIG. 3, dome switch 406 may have a top portion 452 positioned adjacent (but not necessarily touching) keycap 300 and top panel 412 of switch housing 400. Dome switch 406 may also have a bottom portion 454 positioned opposite top portion 452. As shown in FIG. 3, bottom portion 454 may be coupled and positioned at least partially through switch housing 400 coupled to PCB 500. More specifically, an end 456 of bottom portion 454 of dome switch 406 may be positioned within and/or coupled to a recess 458 formed through the sidewalls of switch housing 400. As shown in FIG. 3, recess 458 may extend only partially through switch housing 400 and may be formed in switch housing 400, adjacent PCB 500. The end 456 of dome switch 406 may be a protrusion, projection, semicircular section, or the like. Typically, although not necessarily, multiple ends project from a single dome switch.

Figure 4:
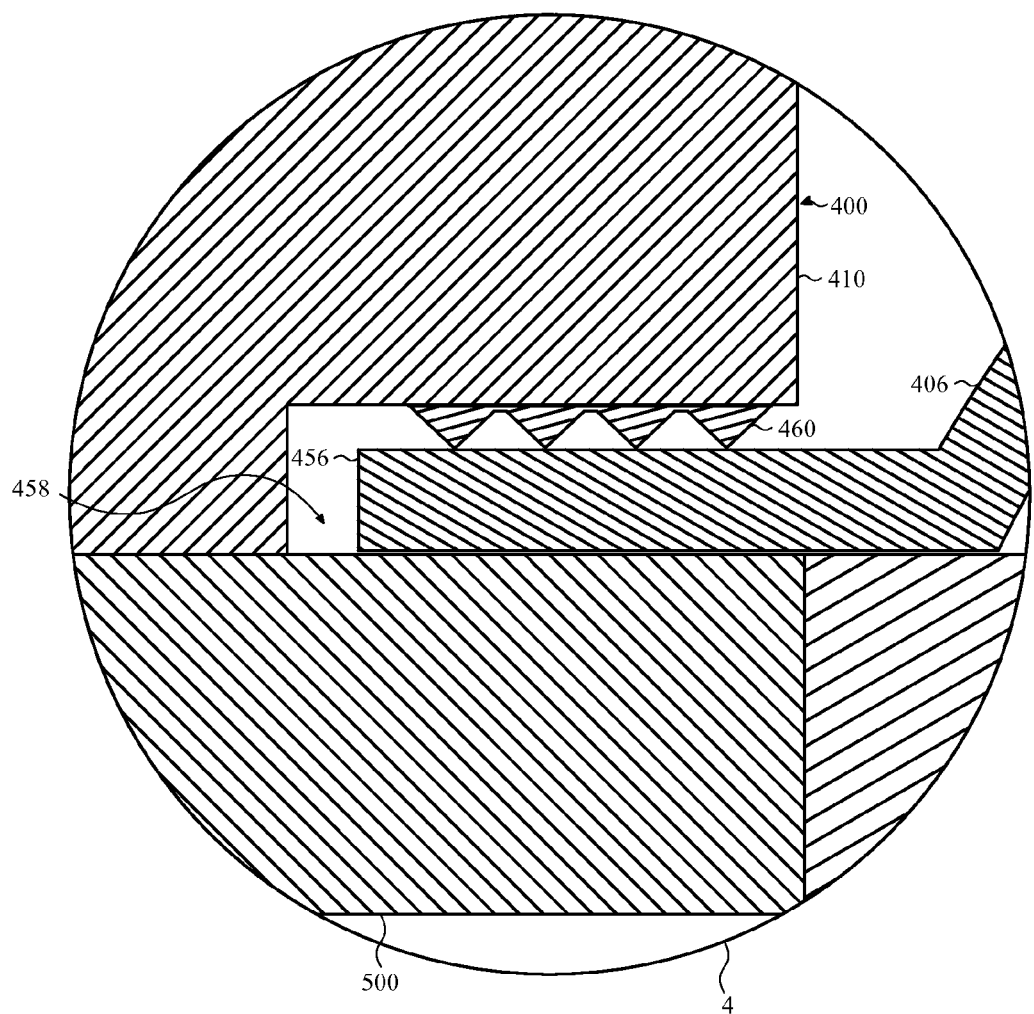
FIG. 4 shows an enlarged cross-section view of a portion of the low-travel keyboard assembly including the dome switch and the switch housing as shown in FIG. 3, according to embodiments. The switch housing includes barbs for securing the dome switch within the housing.
Figure 5:
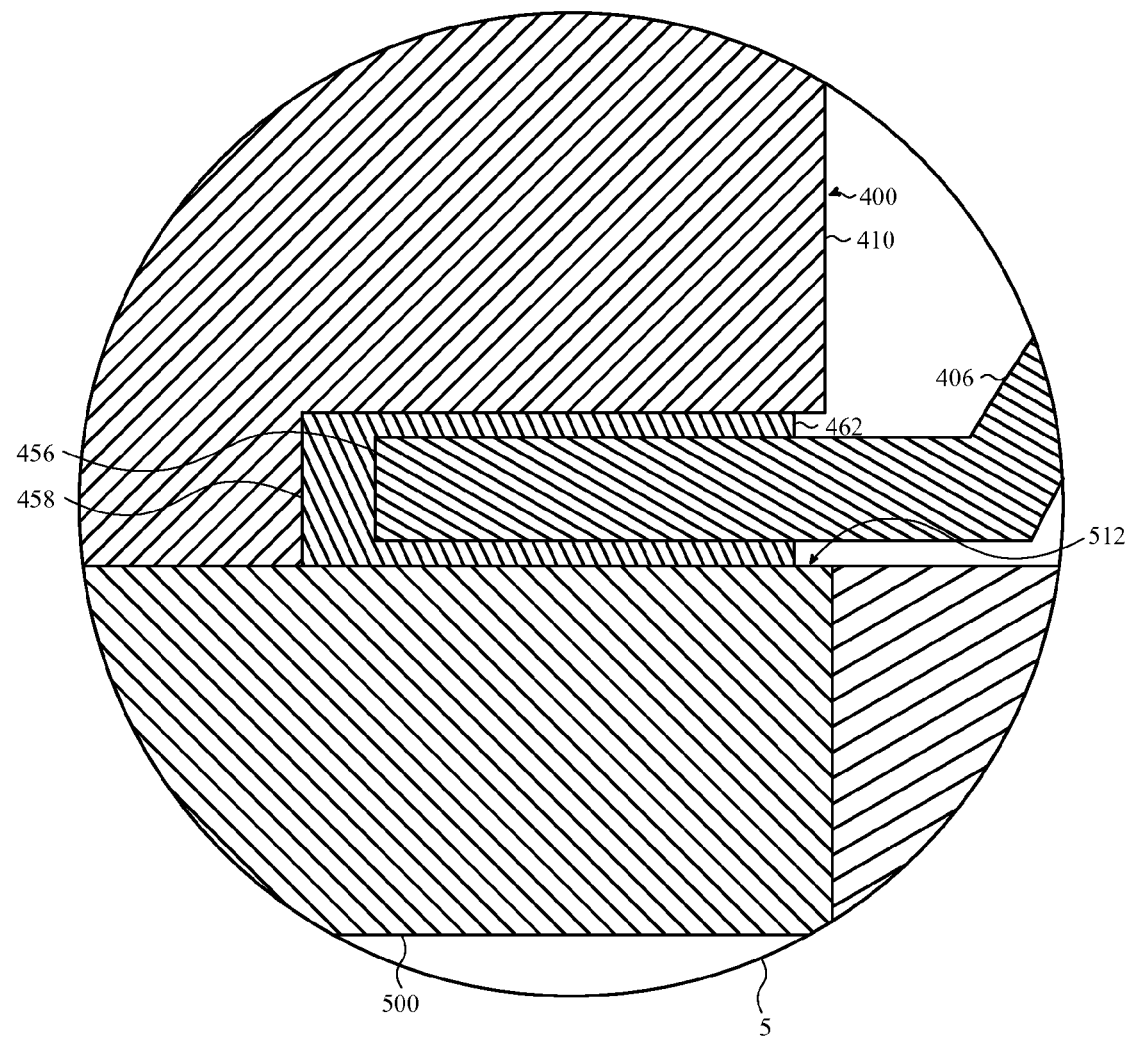
FIG. 5 shows an enlarged cross-section view of a portion of the low-travel keyboard assembly including the dome switch and the switch housing as shown in FIG. 3, according
Figure 6:
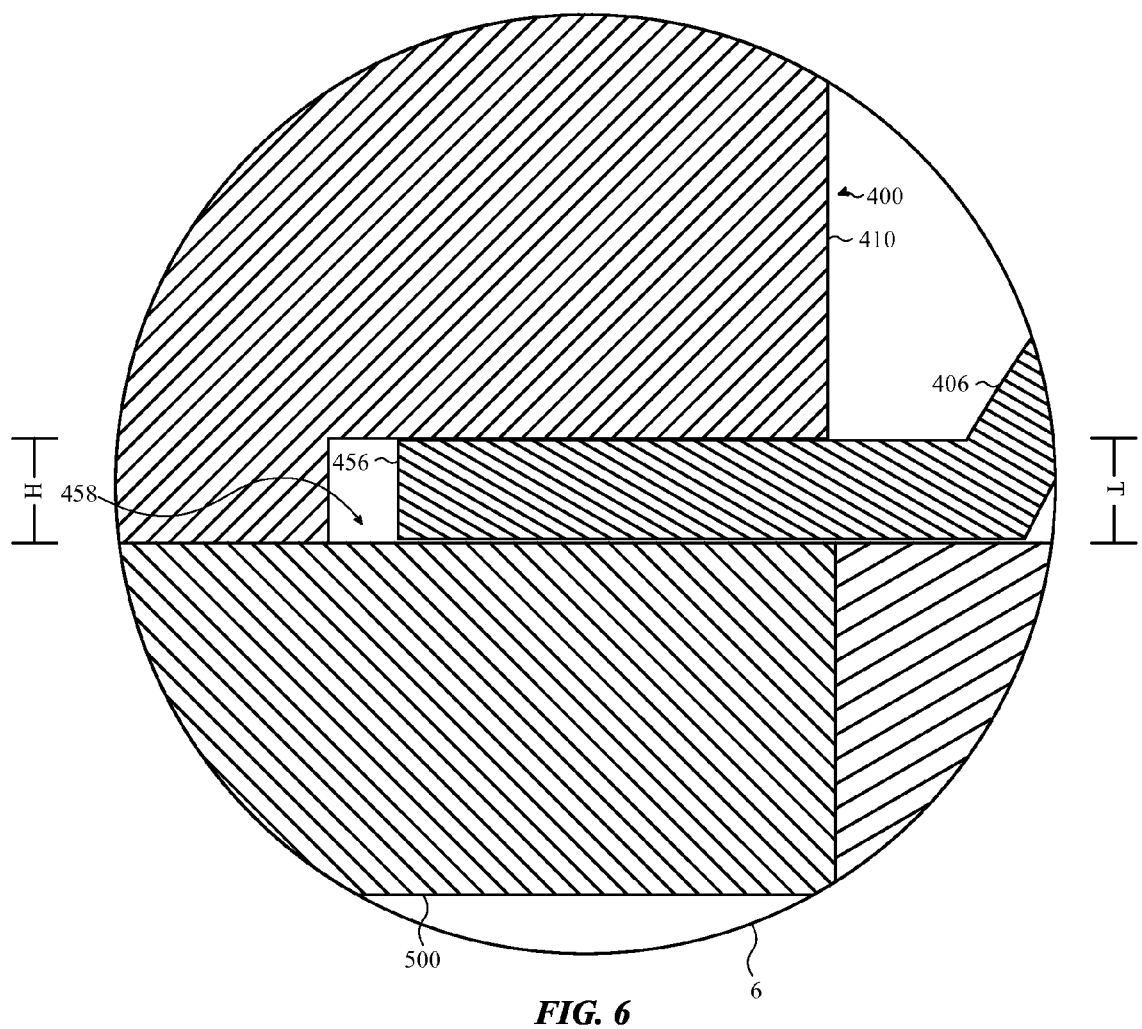
FIG. 6 shows an enlarged cross-section view of a portion of the low-travel keyboard assembly including the dome switch and the switch housing as shown in FIG. 3, according to embodiments. The dome switch is secured within the switch housing using a compression fit or a friction fit.

FIGS. 4-6 show an enlarged portion of dome switch 406 positioned within recess 458 of switch housing 400 of FIG. 3, according to embodiments. As shown in FIG. 4 and discussed herein, end 456 of bottom portion 454 (see. FIG. 3) of dome switch 406 may be positioned within and/or coupled or secured within recess 458 of body portion 410 of switch housing 400. Recess 458 formed in switch housing 400 may have barbs 460 formed within recess 458. More specifically, as shown in FIG. 4, barbs, detents, protrusions and other retaining elements 460 (collectively, "barbs") may be formed within recess 458 and may contact and/or secure end 456 of dome switch 406 within recess 458 between switch housing 400 and PCB 500. The barbs 460 may secure end 456 within recess 458 by gripping or partially inserting a portion of each barb 460 into end 456 of dome switch 406.

FIGS. 5 and 6 depict additional features for securing end 456 within recess 458 of switch housing 400. Specifically, FIG. 5 depicts switch housing 400 including an adhesive 462 positioned within recess 458 for securing or adhering end 456 within recess 458. As shown in FIG. 5, adhesive 462 may be formed or positioned within recess 458 and may adhere to end 456 of dome switch 406 to body portion 410 of switch housing and PCB 500. As shown in FIG. 5, adhesive 462 may be positioned on a first surface 512 of PCB 500, adjacent recess 458, to secure end 456 of dome switch 406 within recess 458 of switch housing 400.

FIG. 6 depicts end 456 of bottom portion 454 (see, FIG. 3) of dome switch 406 being secured within recess 458 of switch housing 400 via a compression fit or friction fit. Recess 458 formed in body portion 410 may have a height (H) substantially equal to a thickness (T) of end 456 of dome switch 406. As such, when end 456 is positioned within recess 458, end 456 may be sandwiched between recess 458 of switch housing 400 and PCB 500. As a result, a compression or friction fit may be formed between end 456 of dome switch 406 of switch housing 400 and PCB 500 for securing end 456 within recess 458.

Figure 7:
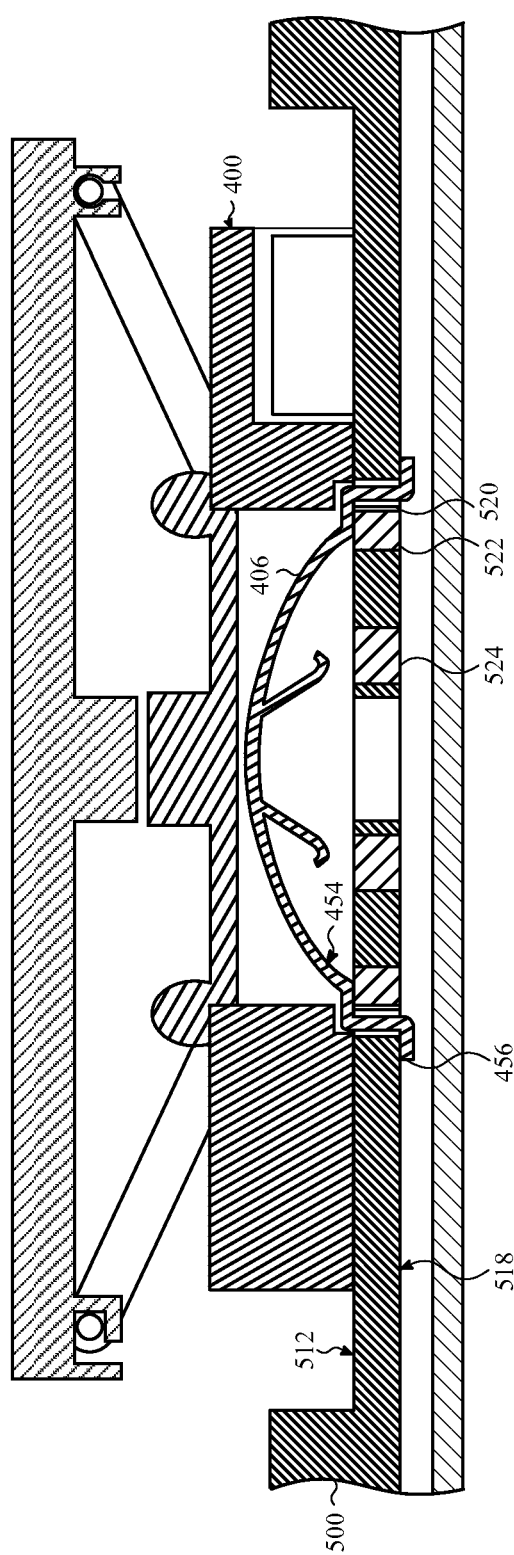
FIG. 7 shows a cross-section view of a low-travel keyboard assembly including a dome switch and a PCB, according to embodiments. An end of the dome switch is positioned completely through the PCB to secure the dome switch in the low-travel keyboard assembly.

FIG. 7 shows end 456 of dome switch 406 positioned completely through and/or secured only to PCB 500, according to embodiments. As shown in FIG. 7, end 456 of dome switch 406 may be positioned through a through hole 520 of PCB 500 and may be secured to a second surface 518 of PCB 500 opposite first surface 512. Through hole 520 of PCB 500 may be formed adjacent a first electrical connector 522 of PCB 500 and opposite second electrical connector 524. As shown in FIG. 7, through hole 520 may be formed in PCB 500 for allowing end 456 of dome switch 406 to be secured to PCB 500, specifically, second surface 518, while also allowing dome switch 406 to remain in continuous electrical contact with first electrical connector 522. Bottom portion 454 of dome switch 406 may remain in electrical contact with first electrical connector 522 of PCB 500, and dome switch 406 may be maintained within dome switch opening 402 by passing end 456 through PCB 500 and securing end 456 to second surface 518 of PCB 500. In some embodiments, the electrical connector 522 may be positioned within the recess 458 or on second surface 518, such that the end 456 of the dome switch is in electrical connection with the electrical connector instead of (or in addition to) another portion of the dome switch.

Figure 8:
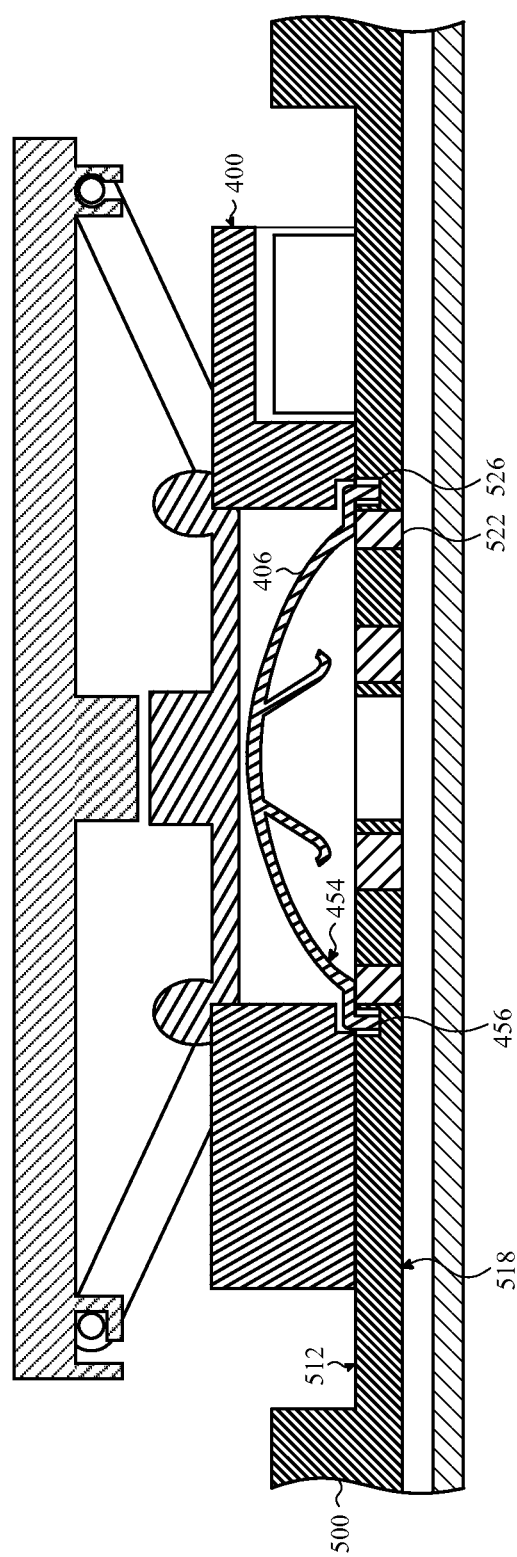
FIG. 8 shows a cross-section view of a low-travel keyboard assembly including a dome switch and a PCB, according to various embodiments. An end of the dome switch is positioned partially through the PCB to secure the dome switch in the low-travel keyboard assembly.

FIG. 8 shows end 456 of dome switch 406 positioned partially through and/or secured to PCB 500. As shown in FIG. 8, end 456 of dome switch 406 may be positioned partially through PCB 500 and may be secured within a PCB recess 526 of PCB 500. PCB recess 526 may be formed partially through PCB 500, such that end 456 of dome switch 406 is positioned and/or secured within PCB 500 between first surface 512 and second surface 518 of PCB 500. End 456 of dome switch 406 may be secured within PCB recess 526 using barbs, adhesive, or a compression/friction fit, as previously discussed herein with respect to FIGS. 4-6. Additionally, PCB recess 526 of PCB 500, like through hole 520 (see, FIG. 7), may be formed in PCB 500 for allowing end 456 of dome switch 406 to be secured to PCB 500, while also allowing bottom portion 454 of dome switch 406 to remain in continuous electrical contact with first electrical connector 522.

As shown in FIGS. 3-8, end 456 may be electrically grounded on PCB 500. More specifically, as shown in FIGS. 3-8, end 456, whether positioned in recess 458 of switch housing 400 (see, FIGS. 3-6), completely through PCB 500 (see, FIG. 7) or partially though PCB 500 (see, FIG. 8), may contact PCB 500 and may be electrically grounded.

Figure 9:
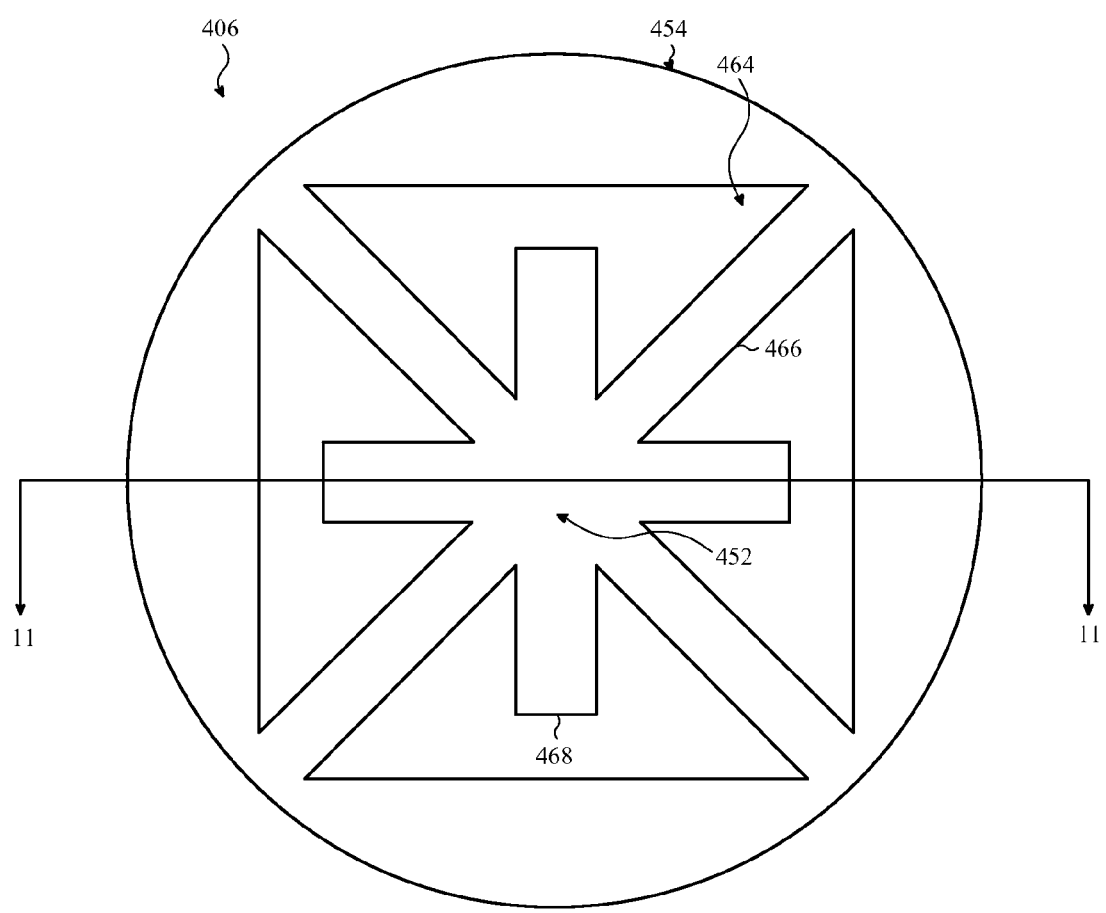
FIG. 9 shows a dome switch of a low-travel keyboard assembly, according to embodiments.
Figure 10:
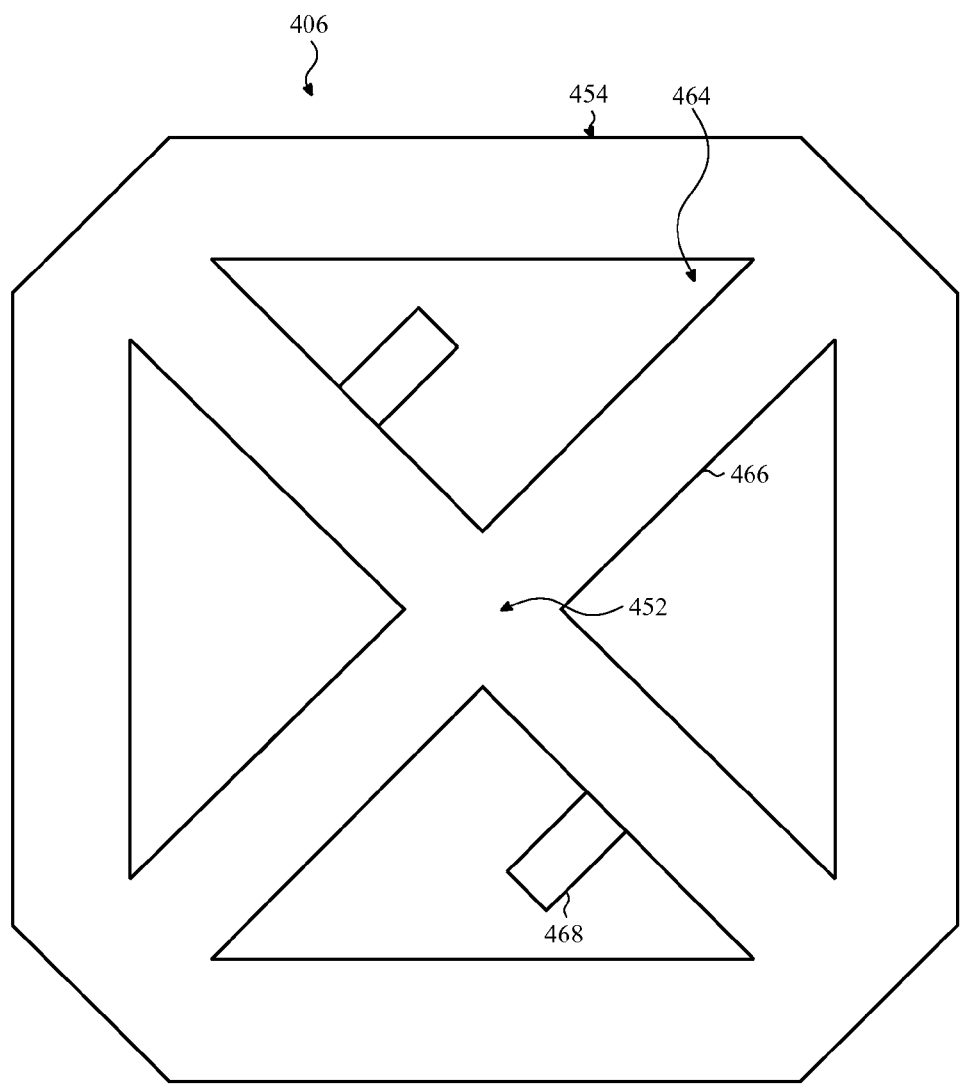
FIG. 10 shows a dome switch of a low-travel keyboard assembly, according to additional embodiments.

FIGS. 9 and 10 depict illustrative top views of dome switch 406 of low-travel keyboard assembly 200. As discussed herein with respect to FIGS. 3-8, dome switch 406 may include top portion 452 and bottom portion 454 positioned adjacent top portion 452. Dome switch 406 may also have a number of tuning members 464 integrated within dome switch 406. As shown in FIGS. 9 and 10, tuning members 464 may be apertures, void spaces, stiffened or strengthened regions, and so on, formed through dome switch 406, between top portion 452 and bottom portion 454. Tuning members 464 may be formed in dome switch 406 to adjust and/or tune the amount of force required to move dome switch from an uncollapsed state to a collapsed state, as discussed herein.

Dome switch 406 may also have one or more arms 466 extending from bottom portion 454 to top portion 452. As shown in FIGS. 9 and 10, as a result of forming tuning members 464 in dome switch 406, arms 466 may be formed in dome switch 406 to connect top portion 542 and bottom portion 454. Additionally, the arms 466 may provide structural support to dome switch 406 in an uncollapsed state and may substantially deform in a collapsed state, as discussed herein.

As shown in FIGS. 9 and 10, dome switch 406 may also have one or more contact protrusions 468. The contact protrusions 468 may extend into tuning members 464. More specifically, the contact protrusions 468 may extend partially into tuning members 464 from top portion 452 of dome switch 406 (see, FIG. 9), or at least one of the arms 466 of dome switch 406 (see, FIG. 10). As shown in FIG. 9, each tuning member 464 of dome switch 406 may have a distinct contact protrusion 468 extending from top portion 452 in tuning member 464. Distinct from FIG. 9, dome switch 406 shown in FIG. 10 may only include two distinct contact protrusions 468 that may extend from a distinct arm 466 into tuning member 464. The contact protrusions 468 may be any suitable shape or size, and may be formed integrally with (or separately from) the dome switch 406. The contact protrusions may be stepped or otherwise discontinuously joined to the dome switch or may form a uniform surface therewith.

Dome switch 406, as shown in FIGS. 9 and 10, may be at least partially formed from a conductive material for forming an electrical contact within low-travel keyboard assembly 200. In a non-limiting example shown in FIG. 9, the contact protrusions 468 may be formed integrally within dome switch 406, where dome switch 406 is formed entirely from an electrically conductive material that may be substantially deformable. In another non-limiting example shown in FIG. 10, the contact protrusions 468 may be distinct from and separately coupled to the arms 466 of dome switch 406. The contact protrusions 468 in FIG. 10 may be formed from an electrically conductive material, and the remainder of dome switch 406 (e.g., top portion 452, bottom portion 454, arms 466) may be formed from a distinct electrically conductive material. As discussed herein, dome switch 406, as a whole, may be formed (partially or fully) or incorporate a structure made from electrically conductive material to form an electrical contact or signal within low-travel keyboard assembly 200.

Figure 11A:
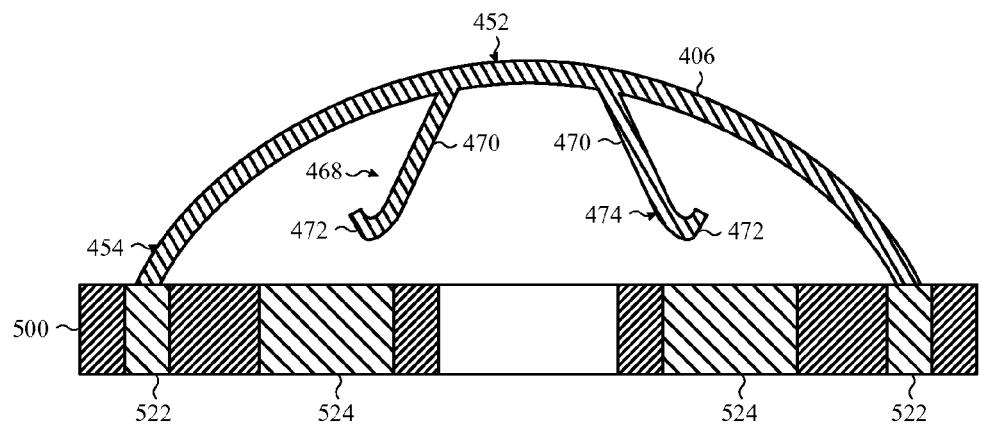
FIG. 11A shows a cross-section view of the dome switch of FIG. 9, taken along line 11-11, according to embodiments. The dome switch is shown in an uncollapsed state.
Figure 11B:
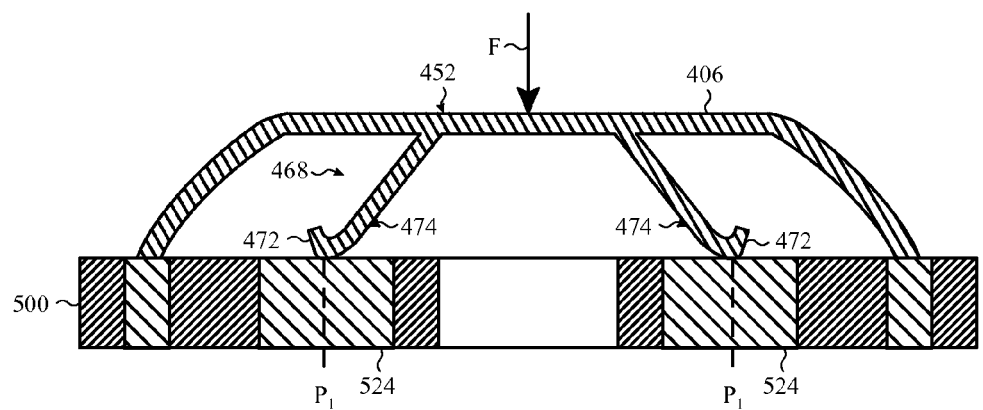
FIG. 11B shows a cross-section view of the dome switch of FIG. 11A in a partially-collapsed state after a force is applied, according to embodiments.
Figure 11C:
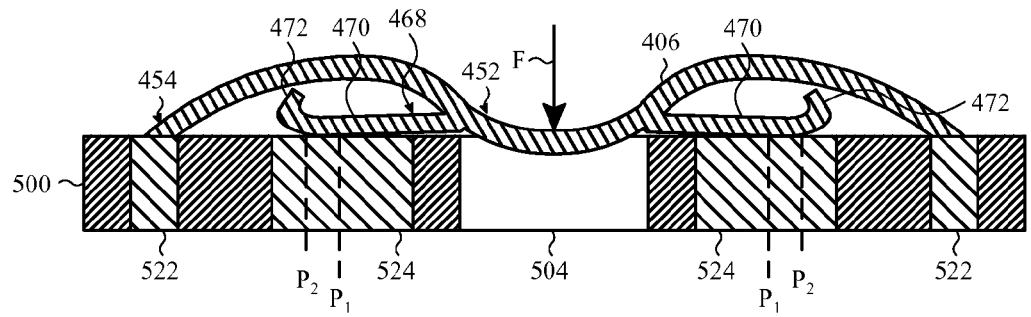
FIG. 11C shows a cross-section view of the dome switch of FIG. 11B in a collapsed state after a force is applied, according to embodiments.

FIGS. 11A-11C show a front cross-sectional view of dome switch 406 taken along line 11-11 in FIG. 9 in various states of collapse/compression. In addition to extending into tuning member 464 of dome switch 406, as shown in FIG. 9, the contact protrusions 468 may extend and/or be positioned angularly toward bottom portion 454 of dome switch 406. In a non-limiting example shown in FIG. 11A, the contact protrusions 468 may extend angularly toward PCB 500 and may be positioned between top portion 452 and bottom portion 454 of dome switch 406 in an uncollapsed state. The contact protrusions 468 may also be substantially aligned with and/or positioned above second electrical connector 524 of PCB 500 in an uncollapsed state of dome switch 406. As discussed herein with respect to FIG. 7, bottom portion 454 of dome switch may remain in electrical contact with first electrical connector 522 of PCB 500.

The contact protrusions 468 may have a substantially linear armature 470 extending from dome switch 406 and a curved portion 472 extending from an end of the linear armature 470. As shown in FIG. 11A, curved portion 472 may be formed integrally with and extend from substantially linear armature 470 toward second electrical connector 524 of PCB 500. Also, curved portion 472 may be positioned between top portion 452 and bottom portion 454 in an uncollapsed state of dome switch 406. Contact protrusion 468 may include a curved contact surface 474 for contacting a second electrical connector 524 of PCB 500. As discussed herein, substantially linear armature 470 and curved portion 472 may be formed from an electrically conductive material.

FIG. 11B shows dome switch 406 in a partially-collapsed state. As discussed herein, a force (F) may be applied to top portion 452 via keycap 300 and/or top panel 412 of switch housing 400 to deform dome switch 406 to form an electrical connection or signal within low-travel keyboard assembly 200 of electronic device 100 (see, FIG. 1). In a partially-collapsed state of dome switch 406, top portion 452 and/or armatures or arms 466 (see, FIG. 9) may only partially-deform and/or may not be completely collapsed. In the non-limiting example shown in FIG. 11B, top portion 452 of dome switch 406 may be substantially parallel with PCB 500 in a partially-collapsed state.

Additionally, as shown in FIG. 11B, the contact protrusions 468 may contact second electrical connector 524 of PCB 500 when dome switch 406 is at least partially collapsed. More specifically, curved contact surface 474 of contact protrusion 468 may contact second electrical connector 524 of PCB 500 when dome switch 406 is in a partially-collapsed state. As shown in FIG. 11B, when dome switch 406 is at least partially collapsed, curved contact surface 474 and curved portion 472 may contact second electrical connector 524 at a first position (P1). As a result of contact protrusion 468 contacting second electrical connector 524 of PCB 500, an electrical connection may be formed between dome switch 406 and PCB 500, creating an electrical signal within low-travel keyboard assembly 200.

FIG. 11C depicts dome switch 406 in a completely collapsed/compressed state. When dome switch 406 is completely collapsed/compressed, top portion 452 and/or arms 466 (see, FIG. 9) may deform and/or may collapse such that top portion 452 of dome switch 406 is substantially in alignment with bottom portion 454. In a non-limiting example shown in FIG. 11C, top portion 452 of dome switch 406 may also be positioned within aperture 504 formed in PCB 500 in the collapsed state of dome switch 406. By extending top portion 452 through aperture 504 of PCB 500 in a collapsed state of dome switch 406, an improved tactile feel or click may be experienced by the user of low-travel keyboard assembly 200.

Like FIG. 11B, the contact protrusions 468 may contact second electrical connector 524 of PCB 500 when dome switch 406 is collapsed/compressed. As shown in FIG. 11C curved contact surface 474 (see, FIG. 11A) of contact protrusion 468 may remain in contact and/or slidingly contact second electrical connector 524 of PCB 500 during collapse of the switch. In the non-limiting example, when dome switch 406 is in the collapsed state, curved contact surface 474 of curved portion 472 may contact second electrical connector 524 at a second position (P2). The second position (P2) of contact for curved portion 472 of contact protrusion 468 may be closer to first electrical connector 522 of PCB 500 than the first position (P1) in the partially-collapsed state of dome switch 406, as shown in FIG. 11B. That is, when dome switch 406 moves from a partially-collapsed state (see, FIG. 11B) to a fully collapsed state (see, FIG. 11C), curved portion 472 of contact protrusion 468 may maintain its contact with second electrical connector 524 and slide toward first electrical connector 522. As a result of contact protrusion 468 maintaining its contact with second electrical connector 524 of PCB 500, an electrical connection may continue to be formed between dome switch 406 and PCB 500, creating an electrical signal within low-travel keyboard assembly 200.

Additionally, as shown in FIG. 11C, a portion of substantially linear armature 470 may also contact second electrical connector 524 of PCB 500 in a collapsed state of dome switch 406. In the non-limiting example, as curved portion 472 slidingly contacts second electrical connector 524 and top portion 452 of dome switch 406 deforms or collapses, substantially linear armature 470 of contact protrusion 468 may move toward PCB 500 and may contact second electrical connector 524 to also aid in maintaining the electrical connection formed between dome switch 406 and PCB 500.

As a result of the configuration of the contact protrusions 468 in dome switch 406 and contact protrusion 468 contacting second electrical connector 524 of PCB 500 in a partially-collapsed state, an electrical connection may be formed between dome switch 406 and PCB 500 before dome switch 406 is completely collapsed. As such, a user may not be required to completely depress the keycap 300 and/or collapse dome switch 406 before an electrical connection is made within low-travel keyboard assembly 200. This may result in faster response and/or interaction time between a user and electronic device 100 including low-travel keyboard assembly 200.

Although shown in FIGS. 11A-11C as having contact protrusions 468 that extend angularly toward PCB 500, dome switch 406 may have distinct configurations. In a non-limiting example shown in FIGS. 12A-12C, dome switch 406 may substantially surround an inner contact component, such as for example, a contact plate, strip, or second dome 476 (hereafter, "contact plate 476") contacting and/or in electrical communication with second electrical connector 524 of PCB 500. Dome switch 406 and contact plate 476 may be partially or fully formed from a substantially flexible, conductive material (or may incorporate a structure made of a conductive material), such that when dome switch 406 is partially-collapsed (see, FIG. 12B) or completely collapsed (see, FIG. 12C), dome switch 406 contacts contact plate 476 to complete an electrical circuit and/or form an electrical signal within low-travel keyboard assembly 200, as discussed herein. Thus, the dome switch and contact plate may cooperatively generate the electrical signal.

Figure 12A:
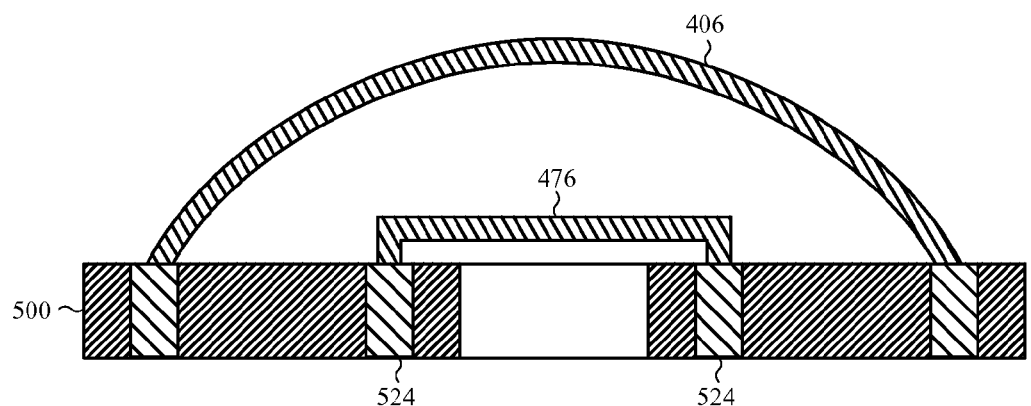
FIG. 12A shows a cross-section view of another dome switch and an inner contact component, according to embodiments.
Figure 12B:
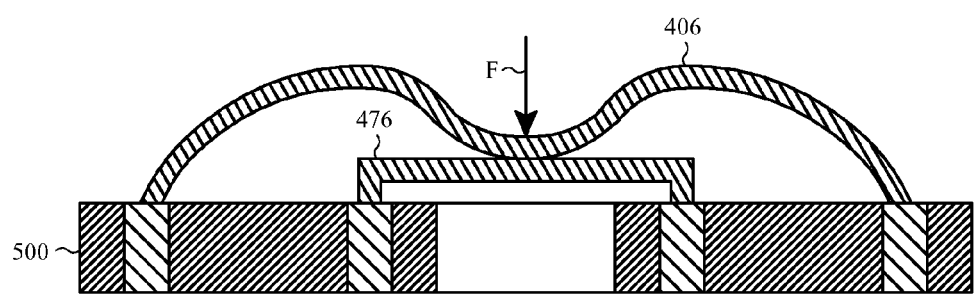
FIG. 12B shows a cross-section view of the dome switch of FIG. 12A in a partially-collapsed state after a force is applied, according to embodiments.

Additionally, contact plate 476 may be configured as a substantially flat strip of conductive material that may be contacted by dome switch 406 to generate an electrical signal. As shown in FIG. 12B, when dome switch 406 is partially-collapsed, dome switch 406 contacts contact plate 476 to generate the electrical signal within low-travel keyboard assembly 200 (see, FIGS. 1-3), without necessarily deforming or deflecting contact plate 476 (e.g., the contact plate is undeformed).

In another non-limiting embodiment, contact plate 476 may be a substantially curved plate or strip that may have a curvature similar to the curvature of the collapsed or deformed dome switch 406, when dome switch 406 contacts contact plate 476 to create an electrical signal. In the non-limiting example, the curvature of contact plate 476 may substantially receive and/or match dome switch 406 when dome switch 406 is collapsed. In the non-limiting examples, contact plate 476 may be formed from a substantially compliant conductive material, as discussed herein, or alternatively, may be formed from a substantially rigid conductive material.

Figure 12C:
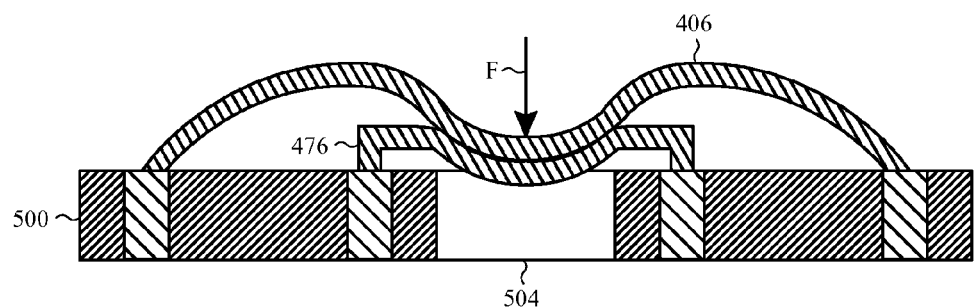
FIG. 12C shows a cross-section view of the dome switch and the contact plate of FIG. 12B, the dome switch is in a collapsed state after a force is applied, according to embodiments.

Additionally, and as similarly discussed herein with respect to FIG. 12C, both dome switch 406 and contact plate 476 may deform when dome switch 406 is in a collapsed state and at least a portion of one or both may be positioned within aperture 504 of PCB 500. In the non-limiting example shown in FIG. 12C, both dome switch 406 and contact plate 476 may deform or deflect when dome switch 406 is completely collapsed, and a portion of dome switch 406 and/or contact plate 476 may be enter into aperture 504 of PCB 500. In some embodiments, contact plate 476 and/or dome switch 406 may deform to such an extent that it (or they) extend completely through the aperture 504 and are flush with a base of PCB 500, or even extend below the base. By permitting one or both of the contact plate 476 (e.g., inner contact component) and dome switch 406 to enter into and/or pass through aperture 504, the overall space above the PCB 500 that is required for the dome switch 406 and/or inner contact component 476 to deform, collapse, and/or cooperatively form an electrical signal may be reduced.

Figure 13:
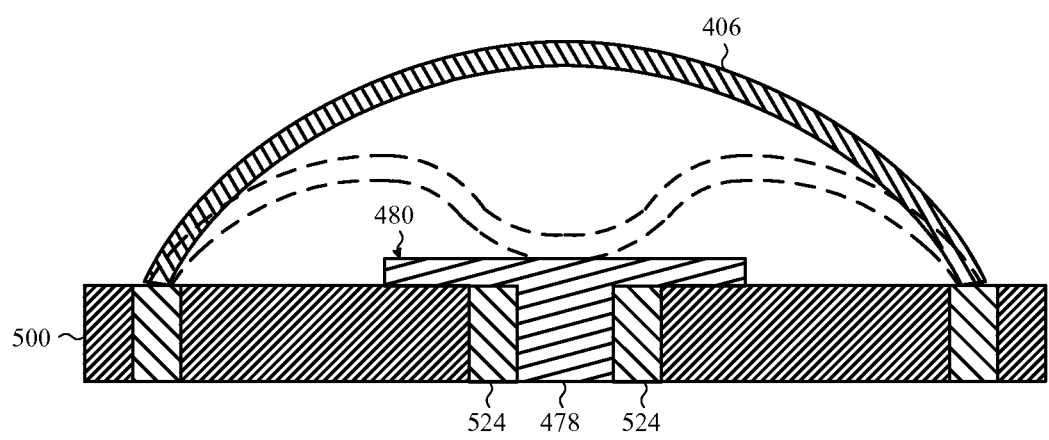
FIG. 13 shows a cross-section front view of an additional dome switch including a conductive plug, according to embodiments.

FIG. 13 shows another configuration of dome switch 406 of low-travel keyboard assembly 200, according to embodiments. As shown in FIG. 13, aperture of PCB 500 (see, FIGS. 11A-12C) may be substantially filled with an inner contact component, such as a conductive plug 478. Conductive plug 478 is in electrical communication with second electrical connectors 524. Conductive plug 478 may be formed from a substantially conductive material that may be molded, deposited or formed and subsequently pressed into aperture 504 of PCB 500, for forming an electrical connection within low-travel keyboard assembly 200. When dome switch 406 is in a collapsed state (shown in phantom), dome switch 406 may contact an enlarged contact surface 480 of conductive plug 478 to complete an electrical circuit and/or form an electrical signal within low-travel keyboard assembly 200, as discussed herein.

Although discussed herein as a keyboard assembly, it is understood that the disclosed embodiments may be used in a variety of input devices used in various electronic devices. That is, the low-travel keyboard assembly and the components of the assembly discussed herein may be utilized or implemented in a variety of input devices for an electronic device including, but not limited to: buttons, switches, toggles, wheels, and touch screens.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A keyboard assembly comprising:
   a printed circuit board comprising:
     a first electrical connector; and
     a second electrical connector adjacent the first electrical connector;
   an inner contact component contacting and in electrical communication with the second electrical connector; and
   a dome switch surrounding the inner contact component, the dome switch contacting and in electrical communication with the first electrical connector, wherein:
   the printed circuit board defines an opening beneath the inner contact component; and
   the dome switch and the inner contact component are configured to contact one another in response to a depression of a keycap, thereby triggering a switch event; and
   the inner contact component is configured to displace at least partially into the opening and remain spaced apart from the printed circuit board within the opening in response to the depression of the keycap.

2. The keyboard assembly of claim 1, wherein the inner contact component comprises a strip formed from a substantially flexible, conductive material.

3. The keyboard assembly of claim 2, wherein the dome switch and the strip are operative to cooperatively generate an electrical signal.

4. The keyboard assembly of claim 2, wherein:
   the dome switch contacts the strip when the dome switch is partially collapsed; and
   the strip is undeformed when the dome switch is partially collapsed.

5. The keyboard assembly of claim 1, wherein:
   the inner contact component comprises a conductive plug positioned in the opening; and the conductive plug is in electrical communication with the second electrical connector.

6. The keyboard assembly of claim 5, wherein the dome switch contacts a contact surface of the conductive plug.

7. A keyboard assembly, comprising:
   a dome switch comprising:
     a domed structure defining:
       a top portion positioned adjacent a keycap of the keyboard assembly;
       a bottom portion extending from the top portion; and
       an end extending from the bottom portion; and
     a set of contact protrusions extending angularly from the top portion and toward the printed circuit board; and
   a printed circuit board positioned beneath the dome switch and supporting the dome switch, the printed circuit board comprising a first electrode and a second electrode separated along a top surface; wherein the end:
     passes at least partially through at least one of the printed circuit board and a switch housing coupled to the printed circuit board; and
     is electrically grounded within at least one of the printed circuit board or the switch housing.

8. The keyboard assembly of claim 7, wherein the domed structure is operative to collapse at least partially through an aperture formed in the printed circuit board.

9. The keyboard assembly of claim 8, wherein:
   the printed circuit board comprises:
   a first surface positioned adjacent the bottom portion of the dome switch; and
   a second surface positioned opposite the first surface; wherein
   the end of the dome switch extends completely through the printed circuit board and onto the second surface of the printed circuit board.

10. The keyboard assembly of claim 9, wherein the end is positioned partially through the printed circuit board and is grounded within the printed circuit board.

11. A keyboard assembly, comprising:
    a printed circuit board;
    a switch housing positioned on the printed circuit board, the switch housing defining a switch opening; and
    a dome switch positioned within the switch opening of the switch housing, the dome switch comprising:

a domed body; and one or more contact protrusions fixed to the domed body at a first end and having a second free end, opposite the first end, extending angularly from the domed body and configured to deform in response to contact with the printed circuit board.

12. The keyboard assembly of claim 11, further comprising a keycap positioned above the switch housing, and collapsing the dome switch to form an electrical connection.

13. The keyboard assembly of claim 11, further comprising:

a first electrical connector in the printed circuit board, and in contact with a bottom portion of the dome switch;

a second electrical connector in the printed circuit board and substantially aligned with the one or more contact protrusions of the dome switch; and an aperture formed in the printed circuit board adjacent the second electrical connector, the opening aligned with the switch opening of the switch housing.

14. The keyboard assembly of claim 13, wherein the one or more contact protrusions of the dome switch contact the second electrical connector.

15. The keyboard assembly of claim 13, wherein the one or more contact protrusions of the dome switch are positioned above the second electrical connector formed in the printed circuit board when the dome switch is uncollapsed.

16. The keyboard assembly of claim 15, wherein the one or more contact protrusions of the dome switch contact the second electrical connector at a first position when the dome switch is partially collapsed.

17. The keyboard assembly of claim 16, wherein the one or more contact protrusions of the dome switch contact the second electrical connector at a second position when the dome switch is fully collapsed.

18. The keyboard assembly of claim 17, wherein the one or more contact protrusions of the dome switch collapse in order to contact the second electrical connector at the second position.

19. The keyboard assembly of claim 17, wherein a portion of the dome switch is positioned within the aperture formed in the printed circuit board when the dome switch is fully collapsed.

* * * * *